(12) United States Patent
Kato

(10) Patent No.: US 9,385,020 B2
(45) Date of Patent: Jul. 5, 2016

(54) SUBSTRATE HOLDING AND ROTATING DEVICE, SUBSTRATE TREATMENT APPARATUS INCLUDING THE DEVICE, AND SUBSTRATE TREATMENT METHOD

(75) Inventor: Hiroshi Kato, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 857 days.

(21) Appl. No.: 13/596,848

(22) Filed: Aug. 28, 2012

(65) Prior Publication Data

US 2013/0152971 A1 Jun. 20, 2013

(30) Foreign Application Priority Data

Dec. 19, 2011 (JP) ................................. 2011-277402
Mar. 28, 2012 (JP) ................................. 2012-074620

(51) Int. Cl.
*H01L 21/67* (2006.01)
*H01L 21/687* (2006.01)

(52) U.S. Cl.
CPC .... *H01L 21/68728* (2013.01); *H01L 21/68792* (2013.01)

(58) Field of Classification Search
CPC .................. H01L 21/68714; H01L 21/68742; H01L 21/68785; H01L 21/68764
See application file for complete search history.

(56) References Cited

U.S. PATENT DOCUMENTS

| 5,601,645 A | 2/1997 | Nonomura et al. | |
| 5,989,342 A * | 11/1999 | Ikeda et al. | 118/52 |
| 2004/0055707 A1 | 3/2004 | Sato et al. | 156/345.11 |
| 2009/0120472 A1 | 5/2009 | Nishiyama et al. | 134/157 |
| 2009/0325469 A1 | 12/2009 | Koo et al. | 451/54 |
| 2010/0083986 A1 | 4/2010 | Kamikawa et al. | 134/18 |
| 2010/0126539 A1 | 5/2010 | Lee et al. | 134/157 |
| 2010/0130105 A1 * | 5/2010 | Lee | 451/41 |
| 2011/0303527 A1 | 12/2011 | Hosoya et al. | 204/192.15 |

FOREIGN PATENT DOCUMENTS

| CN | 101436564 A | 5/2009 |
| CN | 101903559 A | 12/2010 |
| JP | 08-323274 A | 12/1996 |
| JP | 09-167751 A | 6/1997 |
| JP | 09-232269 A | 9/1997 |
| JP | 10-135314 | 5/1998 |
| JP | 2004-48034 | 2/2004 |
| JP | 2004-48035 | 2/2004 |
| JP | 2004-128295 A | 4/2004 |
| JP | 2005-142585 | 6/2005 |
| JP | 2008-108790 A | 5/2008 |
| JP | 2008-172161 | 7/2008 |
| JP | 2010-002523 | 1/2010 |
| JP | 2001-332486 A | 11/2011 |
| KR | 10-2008-0062221 A | 7/2008 |
| KR | 10-2010-0002523 A | 1/2010 |
| TW | 200949973 A | 12/2009 |

* cited by examiner

*Primary Examiner* — Joseph L Perrin
*Assistant Examiner* — Irina Graf
(74) *Attorney, Agent, or Firm* — Ostrolenk Faber LLP

(57) ABSTRACT

A substrate holding and rotating device includes: a turntable rotatable; a rotative drive unit which rotates the turntable; a holding member which is provided on the turntable and horizontally holds a substrate in upwardly spaced relation to the turntable; a vertically movable protection disk disposed between the turntable and a substrate holding position; and a magnetic levitation mechanism including a first magnet attached to the protection disk, an annular second magnet which generates a repulsive force with respect to the first magnet, a support member which non-rotatably supports the second magnet, and a relative movement mechanism which moves the support member and the turntable relative to each other.

3 Claims, 12 Drawing Sheets

SUBSTRATE HOLDING AND ROTATING DEVICE, SUBSTRATE TREATMENT APPARATUS INCLUDING THE DEVICE, AND SUBSTRATE TREATMENT METHOD

BACKGROUND OF THE INVENTION

1. Field of the Invention

The present invention relates to a substrate holding and rotating device, a substrate treatment apparatus including the device, and a substrate treatment method. Exemplary substrates to be held or treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates, and substrates for solar cells.

2. Description of Related Art

U.S. Pat. No. 5,601,645 (hereinafter referred to as "U.S. Pat. No. 5,601,645") discloses a substrate rotating and holding device for a substrate spin treating apparatus. The substrate rotating and holding device includes a turntable to be rotated by rotation means, and support means which horizontally positions a substrate held by the turntable so as to space the substrate a predetermined distance from a surface of the turntable. A vertically movable member having substantially the same size as the substrate is provided on the turntable. In a substrate treatment process during which the turntable is rotated, the vertically movable member is located at an upper position adjacent to the substrate. Thus, as stated in U.S. Pat. No. 5,601,645, a distance between a lower surface of the substrate and an upper surface of the vertically movable member is reduced, whereby mist generated during the substrate treatment process is prevented from flowing below the lower surface of the substrate.

An arrangement shown in FIGS. 1 to 3 in U.S. Pat. No. 5,601,645 is adapted to vertically move up and down the vertically movable member relative to the turntable by means of a push-up mechanism which operates in response to a centrifugal force generated by the rotation of the turntable. In an arrangement disclosed in FIGS. 7 and 8 of U.S. Pat. No. 5,601,645, fins are provided in an outer peripheral portion of the vertically movable member and, when the vertically movable member is rotated by the rotation of the turntable, the fins depress ambient gas to generate a lift force to lift the vertically movable member.

With these arrangements, however, it is impossible to move the vertically movable member sufficiently close to the lower surface of the substrate, because the centrifugal force or the lift force cannot be sufficiently generated when the substrate is rotated at a lower rotation speed. As a result, the mist generated during the substrate treatment process is liable to adhere to the lower surface of the substrate. Where an upper surface of the substrate being rotated is scrubbed with a brush, for example, the rotation speed of the substrate is about 100 rpm, making it impossible to sufficiently provide the centrifugal force or the lift force. Therefore, mist of a treatment liquid is liable to intrude into a space defined between the lower surface of the substrate and the vertically movable member during the scrubbing of the upper surface of the substrate, thereby contaminating the lower surface of the substrate.

An arrangement disclosed in FIGS. 9 and 10 of U.S. Pat. No. 5,601,645 is adapted to vertically move up and down the vertically movable member by a push-up mechanism utilizing an air cylinder. Further, an arrangement shown in FIGS. 11 and 12 of U.S. Pat. No. 5,601,645 includes bellows fixed to the vertically movable member at one end thereof, and is adapted to vertically move up and down the vertically movable member by pressurizing and evacuating the inside of the bellows for expansion and contraction of the bellows.

However, these arrangements each have a complicated structure, because driving means for the vertical driving is incorporated in a rotation system including the turntable and the vertically movable member, and requires supply of a driving force. In addition, there is a need for supplying and sucking driving air to/from a non-rotation system, so that a slide portion kept in frictional contact with an air supply/suction passage is present between the non-rotation system and the rotation system. This may result in generation of particles, which may adversely influence the substrate treatment.

SUMMARY OF THE INVENTION

It is an object of the present invention to provide a substrate holding and rotating device which has a simplified construction and yet is capable of protecting a lower surface of a substrate irrespective of the rotation speed of the substrate and suppressing generation of particles attributable to the frictional contact, and to provide a substrate treatment apparatus including such a substrate holding and rotating device. It is another object of the present invention to provide a substrate treatment method which ensures reliable protection of a lower surface of a substrate without a need for a complicated arrangement even if the substrate is rotated at a lower rotation speed, and permits a high-quality substrate treatment while suppressing generation of particles attributable to the frictional contact.

According to the present invention, there is provided a substrate holding and rotating device, which includes: a turntable rotatable about a vertical rotation axis; a rotative drive unit which rotates the turntable; a holding member which is provided on the turntable and horizontally holds a substrate in upwardly spaced relation to the turntable; a protection disk having substantially the same size as the substrate held by the holding member; and a magnetic levitation mechanism which levitates the protection disk from the turntable. The protection disk is disposed between the turntable and a substrate holding position at which the substrate is held by the holding member, and attached to the turntable so as to be vertically movable relative to the turntable between a lower position and an adjacent position close to a lower surface of the substrate held by the holding member above the lower position. The magnetic levitation mechanism includes a first magnet attached to the protection disk, a second magnet which has an annular shape coaxial about the rotation axis and generates a repulsive force with respect to the first magnet, a first support member which non-rotatably supports the second magnet, and a first relative movement mechanism which moves the first support member and the turntable relative to each other so as to change a distance between the first magnet and the second magnet. The magnetic levitation mechanism is configured to levitate the protection disk from the turntable by the repulsive force generated between the first magnet and the second magnet.

With this arrangement, the holding member is provided on the turntable which is to be rotated by the rotative drive unit. The substrate is horizontally held as upwardly spaced from the turntable by the holding member. The protection disk having substantially the same size as the substrate is attached to the turntable. The protection disk is vertically movable relative to the turntable. That is, the protection disk is vertically movable relative to the turntable between the lower position and the adjacent position close to the lower surface of the substrate held by the holding member above the lower position. The magnetic levitation mechanism is provided for driving the protection disk. More specifically, the magnetic levitation mechanism includes the first magnet attached to the protection disk, the second magnet non-rotatably supported by the first support member, and the first relative movement mechanism which moves the first support member and the turntable relative to each other.

With this arrangement, the first support member and the turntable are moved relative to each other so that the second magnet is located at a position sufficiently close to the first magnet below the first magnet, whereby the protection disk is levitated from the turntable to the adjacent position and held at the adjacent position by the repulsive force generated between the first magnet and the second magnet.

A driving force is transmitted from a non-rotation system to a rotation system in a non-contact manner by utilizing the repulsive magnetic force generated between the second magnet in the non-rotation system and the first magnet in the rotation system. With a simplified construction, therefore, the protection disk can be held at the adjacent position by the driving force transmitted in the non-contact manner even if the turntable is rotated and the first magnet attached to the protection disk is correspondingly rotated.

Even if the turntable is rotated at a lower rotation speed or is not rotated, the repulsive force generated between the first magnet and the second magnet levitates the protection disk from the surface of the turntable by moving the first support member and the turntable sufficiently close to each other. Therefore, the protection disk can be located sufficiently close to the lower surface of the substrate.

Thus, the inventive substrate holding and rotating device has a simplified construction, and yet is capable of reliably protecting the lower surface of the substrate irrespective of the rotation speed of the substrate and suppressing generation of particles which may otherwise occur due to frictional contact during rotation.

With the protection disk located at the lower position, a space is defined between the protection disk and the lower surface of the substrate. Therefore, a substrate transport robot utilizes this space to transfer the substrate to the holding member and to receive the substrate from the holding member.

The second magnet preferably has an annular magnetic pole coaxial about the rotation shaft. More specifically, the second magnet preferably has an annular magnetic pole corresponding to a rotation locus of the first magnet. Thus, the repulsive force continuously and stably acts between the first magnet and the second magnet even when the first magnet is rotated together with the turntable. Therefore, the protection disk can be reliably held at the adjacent position.

The first relative movement mechanism may be a mechanism which vertically moves up and down the first support member, a mechanism which vertically moves up and down the turntable, or a mechanism which vertically moves up and down both the first support member and the turntable.

The first relative movement mechanism is not necessarily required to be a mechanism which vertically moves the first support member and the turntable relative to each other, but may be configured to move the second magnet toward the first magnet in a direction crossing the rotation axis so as to cause the repulsive force to act between the first magnet and the second magnet.

According to an embodiment of the present invention, the holding member includes a movable holding member which is movable between a holding position at which the movable holding member holds the substrate and a retracted position to which the movable holding member is retracted from the holding position, and the substrate holding and rotating device further includes a magnetic drive mechanism including a first magnetic member attached to the movable holding member, a second magnetic member which has an annular shape coaxial about the rotation axis and generates a magnetic force with respect to the first magnetic member, a second support member which non-rotatably supports the second magnetic member, and a second relative movement mechanism which moves the second support member and the turntable relative to each other so as to change a distance between the first magnetic member and the second magnetic member, the magnetic drive mechanism being configured to hold the movable holding member at the holding position by the magnetic force generated between the first magnetic member and the second magnetic member.

With this arrangement, the movable holding member can be held at the holding position in a non-contact manner by utilizing the magnetic force generated between the first magnetic member attached to the movable holding member and the second magnetic member non-rotatably supported by the second support member. Therefore, the movable holding member can be held at the holding position by a simplified arrangement. In addition, transmission of a driving force for holding the movable holding member at the holding position can be achieved in a non-contact manner by utilizing the magnetic force. This further suppresses the generation of particles which may otherwise occur due to the frictional contact during the rotation.

Since the second magnetic member is coaxial about the rotation axis, the magnetic force can stably act between the first magnetic member and the second magnetic member at any rotation angular position when the first magnetic member is rotated together with the turntable. Therefore, the movable holding member can be reliably held at the holding position, whereby the substrate can be reliably held.

At least one of the first magnetic member and the second magnetic member is preferably a magnet.

The second relative movement mechanism may be a mechanism which vertically moves up and down the second support member, a mechanism which vertically moves up and down the turntable, or a mechanism which vertically moves up and down both the second support member and the turntable. Further, the second relative movement mechanism is not limited to the mechanisms adapted to vertically move up and down the second support member and/or the turntable, but may be a mechanism configured, for example, to move the second support member in a direction crossing the rotation axis to move the second magnetic member toward or away from the first magnetic member.

According to another embodiment of the present invention, the second magnetic member, the second support member and the second relative movement mechanism serve as the second magnet, the first support member and the first relative movement mechanism, respectively, and the magnetic drive mechanism and the magnetic levitation mechanism share the second magnet, the first support member and the first relative movement mechanism. When the second magnet is located at a predetermined position, the protection disk is held at the adjacent position by the repulsive force generated between the second magnet and the first magnet, and the movable holding member is held at the holding position by the magnetic force generated between the second magnet and the first magnetic member.

With this arrangement, the magnetic drive mechanism and the magnetic levitation mechanism share the second magnet, the first support member and the first relative movement mechanism, and the turntable and the first support member are moved relative to each other by the first relative movement mechanism to drive the protection disk as well as the movable holding member. This further simplifies the construction of the device.

According to further another embodiment of the present invention, the substrate holding and rotating device further includes a limitation member which limits upward relative movement of the protection disk with respect to the turntable at the adjacent position. With this arrangement, the upward relative movement of the protection disk levitated by the magnetic force is limited by the limitation member, so that the protection disk can be reliably located at the adjacent position close to the lower surface of the substrate. Particularly, where the adjacent position is such that the protection disk does not contact the lower surface of the substrate but is spaced a minute distance from the lower surface of the substrate, the minute distance can be maintained between the protection disk and the lower surface of the substrate.

According to still another embodiment of the present invention, the substrate holding and rotating device further includes a guide mechanism which is provided on the turntable and guides the vertical relative movement of the protection disk. This arrangement stabilizes the vertical movement of the protection disk relative to the turntable.

According to further another embodiment of the present invention, the substrate holding and rotating device further includes a lateral side covering member which is attached to the turntable and covers the space defined between the substrate held by the holding member and the turntable from a lateral side. With this arrangement, the space defined between the turntable and the substrate is covered from the lateral side, so that an ambient atmosphere is substantially prevented from being caught into the space from the lateral side. This stabilizes a gas stream flowing around the substrate during the rotation of the substrate.

The lateral side covering member is preferably fixed to the protection disk. In this case, the space defined between the protection disk and the turntable is preferably covered by the lateral side covering member with the protection disk being located at the adjacent position. When the protection disk is located at the lower position, the lateral side of the space defined between the protection disk and the lower surface of the substrate is preferably open, so that the space can be utilized for loading and unloading the substrate.

According to the present invention, there is provided a substrate treatment apparatus which includes the substrate holding and rotating device having the aforementioned features, and a treatment liquid supply unit which supplies a treatment liquid to an upper surface of a substrate held by the substrate holding and rotating device.

With this arrangement, the upper surface of the substrate is treated with the treatment liquid by supplying the treatment liquid to the upper surface of the substrate while covering a lower surface of the substrate with the protection disk. Therefore, even if mist of the treatment liquid is generated, the mist is substantially prevented from reaching the lower surface of the substrate. As a result, the upper surface of the substrate can be selectively treated, while the lower surface of the substrate is kept clean without supplying the treatment liquid to the lower surface of the substrate. More specifically, the upper surface of the substrate can be treated with the treatment liquid with the lower surface of the substrate kept dry without contamination of the lower surface of the substrate.

As described above, the substrate holding and rotating device has a simplified construction and yet is capable of reliably protecting the lower surface of the substrate with the protection disk held at the adjacent position even when the substrate is rotated at a lower speed or not rotated. Further, the generation of particles can be suppressed which may otherwise occur due to the sliding during the rotation. This makes it possible to selectively treat the upper surface of the substrate with the treatment liquid in a clean environment, while suppressing the generation of particles and the adhesion of the mist to the lower surface of the substrate without the need for a complicated arrangement.

According to an embodiment of the present invention, the substrate treatment apparatus further includes a receiving member which receives a treatment liquid supplied from the treatment liquid supply unit to the substrate held by the substrate holding and rotating device and flowing outward from the surface of the substrate. Further, the first support member is fixed to the receiving member, and the first relative movement mechanism is configured to move the receiving member and the turntable relative to each other. With this arrangement, a mechanism for the relative movement of the turntable and the receiving member which receives the treatment liquid flowing outward from the surface of the substrate doubles as a mechanism for moving the first support member which supports the second magnet. This further simplifies the construction of the substrate treatment apparatus.

More specifically, where a positional relationship between the receiving member and the turntable is such that the receiving member receives the treatment liquid flowing outward from the surface of the substrate at a treatment position, the protection disk is preferably held at the adjacent position by the repulsive force generated between the first and second magnets. Further, the movable holding member is preferably held at the holding position while the magnetic force of the second magnet is received by the first magnetic member with the receiving member located at the treatment position.

According to another embodiment of the present invention, the substrate treatment apparatus further includes an inert gas supply unit which supplies an inert gas to a space defined between the substrate held and rotated by the substrate holding and rotating device and the protection disk located at the adjacent position. With this arrangement, the inert gas is supplied to the space defined between the protection disk and the substrate, thereby more effectively suppressing the adhesion of the treatment liquid mist to the lower surface of the substrate.

According to further another embodiment of the present invention, the protection disk has a restriction portion provided on an upper surface thereof for restricting an inert gas flow passage on a peripheral edge of the substrate held by the holding member. With this arrangement, the inert gas flow passage is restricted on the peripheral edge of the substrate, so that an inert gas flow speed is increased around the substrate. This more effectively suppresses the intrusion of the treatment liquid mist into the space defined between the protection disk and the lower surface of the substrate.

According to still another embodiment of the present invention, the inert gas supply unit includes an inert gas nozzle which ejects the inert gas radially toward the peripheral edge of the substrate held by the holding member from the rotation center of the turntable. With this arrangement, an inert gas stream flowing toward the peripheral edge of the substrate from the rotation center of the turntable can be stably formed in the space defined between the protection disk and the lower surface of the substrate by ejecting the inert gas radially from the inert gas nozzle. This more effectively suppresses the intrusion of the treatment liquid mist into the space.

According to the present invention, there is provided a substrate treatment method to be performed by utilizing a substrate holding and rotating device, the substrate holding and rotating device including a turntable rotatable about a vertical rotation axis, a holding member which horizontally holds a substrate, a protection disk attached to the turntable in relatively vertically movable manner and having substantially the same size as the substrate, a first magnet attached to the protection disk, and an annular second magnet non-rotatably provided coaxially about the rotation axis, the substrate treatment method including: a holding step of causing the holding member to horizontally hold the substrate; a rotating step of rotating the substrate held by the holding member by rotating the turntable; a lower surface covering step of moving the first magnet and the second magnet toward each other to levitate the protection disk from the turntable to an adjacent position close to a lower surface of the substrate by a repulsive force generated between the first magnet and the second magnet to cover the lower surface of the substrate; and a treatment liquid supplying step of supplying a treatment liquid to an upper surface of the substrate with the lower surface of the substrate covered with the protection disk in the holding step and the rotating step.

According to this method, the upper surface of the substrate can be treated with the treatment liquid by supplying the treatment liquid to the upper surface of the substrate while rotating the substrate and covering the lower surface of the substrate with the protection disk attached to the turntable. The protection disk is kept levitated at the adjacent position close to the lower surface of the substrate by the repulsive force generated between the first magnet attached to the protection disk and the annular second magnet provided non-rotatably. Therefore, even when the substrate is rotated at a lower speed or not rotated, the adhesion of the treatment liquid mist to the lower surface of the substrate can be reliably suppressed with the protection disk reliably disposed close to the lower surface of the substrate. In addition, the protection disk is levitated and kept in the levitated state by utilizing the repulsive force generated between the first magnet and the second magnet, thereby eliminating the need for providing a driving unit in a rotation system for vertically moving the protection disk. Thus, the protection disk can be moved close to the lower surface of the substrate, as required, without complicating the construction of the device. Since the first magnet and the second magnet can transmit the repulsive force to each other in a non-contact state, the generation of particles can be suppressed which may otherwise occur due to the frictional contact during the rotation.

According to an embodiment of the present invention, the holding member includes a movable holding member which is movable between a holding position at which the movable holding member holds the substrate and a retracted position to which the movable holding member is retracted from the holding position, and the holding step includes the step of holding the movable holding member at the holding position by applying a magnetic force to a magnetic member attached to the movable holding member. In this method, the movable holding member provided on the turntable is held at the holding position by utilizing the magnetic force, so that a holding force can be transmitted to the movable holding member in a non-contact state. This makes it possible to selectively treat the upper surface of the substrate with a further simplified construction while further suppressing the generation of particles which may otherwise occur due to the frictional contact during the rotation.

According to another embodiment of the present invention, the lower surface covering step is the step of locating the second magnet at a predetermined position to levitate the protection disk at the adjacent position by the repulsive force generated between the second magnet and the first magnet, and the holding step is the step of locating the second magnet at the predetermined position to hold the movable holding member at the holding position by a magnetic force generated between the second magnet and the magnetic member.

In this method, it is possible to hold the protection disk at the adjacent position by the repulsive force generated between the first magnet and the second magnet and to hold the movable holding member at the holding position by the magnetic force generated between the second magnet and the magnetic member. That is, this arrangement can be shared for the vertical movement of the protection disk and for the driving of the movable holding member. Thus, the arrangement is further simplified, making it possible to selectively treat the upper surface of the substrate while preventing the adhesion of the treatment liquid mist to the lower surface of the substrate.

According to further another embodiment of the present invention, the method further includes the step of causing a limiting member to limit upward relative movement of the protection disk with respect to the turntable at the adjacent position. This makes it possible to reliably locate the protection disk at the adjacent position, so that the positional relationship between the protection disk and the lower surface of the substrate (particularly a distance between the protection disk and the lower surface of the substrate) can be accurately set.

According to still another embodiment of the present invention, the method further includes the step of causing a receiving member to receive a treatment liquid flowing outward from the substrate during the rotation of the substrate. Further, the second magnet is supported by the receiving member, and the lower surface covering step includes the step of moving the receiving member and the turntable toward each other. In this method, when the turntable and the receiving member which receives the treatment liquid flowing outward from the substrate are moved toward each other, the protection disk is levitated and held at the adjacent position by the repulsive force generated between the first and second magnets. That is, the arrangement for the relative movement of the receiving member and the turntable doubles as the arrangement for the driving of the protection disk. As a result, the arrangement can be further simplified.

When the receiving member and the turntable are moved toward each other, the magnetic force from the second magnet preferably acts on the first magnetic member to move the movable holding member to the holding position and hold the movable holding member at the holding position. Thus, the arrangement for the relative movement of the receiving member and the turntable doubles as the arrangement for the driving of the movable holding member, so that the arrangement can be further simplified.

According to further another embodiment of the present invention, the method further includes an inert gas supplying step of supplying an inert gas to a space defined between the substrate being rotated and the protection disk located at the adjacent position in the treatment liquid supplying step. In this method, the inert gas can be supplied to the space defined between the protection disk and the lower surface of the substrate. This further suppresses the adhesion of the treatment liquid mist to the lower surface of the substrate.

According to still another embodiment of the present invention, the protection disk has a restriction portion provided on an upper surface portion thereof to be opposed to a peripheral edge of the substrate held by the holding member, and the method further includes the step of restricting an inert gas flow passage by the restriction portion in the inert gas supplying step. In this method, the inert gas flow passage is restricted on the peripheral edge of the substrate, so that an inert gas stream is ejected at a higher speed outward from a gap defined between the protection disk and the peripheral edge of the substrate. This more reliably suppresses the intrusion of the treatment liquid mist into the space defined between the protection disk and the lower surface of the substrate.

According to further another embodiment of the present invention, the inert gas supplying step includes the step of ejecting the inert gas radially toward the peripheral edge of the substrate held by the holding member from the rotation center of the turntable. In this method, the inert gas stream flowing toward the peripheral edge of the substrate from the rotation center of the turntable can be stably formed. This more reliably suppresses the intrusion of the treatment liquid mist into the space defined between the protection disk and the lower surface of the substrate.

According to still another embodiment of the present invention, the method further includes the step of covering the space defined between the substrate held by the holding member and the turntable from a lateral side by a lateral side covering member attached to the turntable in the lower surface covering step. In this method, an ambient atmosphere is less liable to be caught into the space defined between the turntable and the lower surface of the substrate, so that a gas stream flowing around the turntable can be stabilized. This suppresses the generation of the treatment liquid mist, making it possible to perform a higher-quality substrate treatment.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
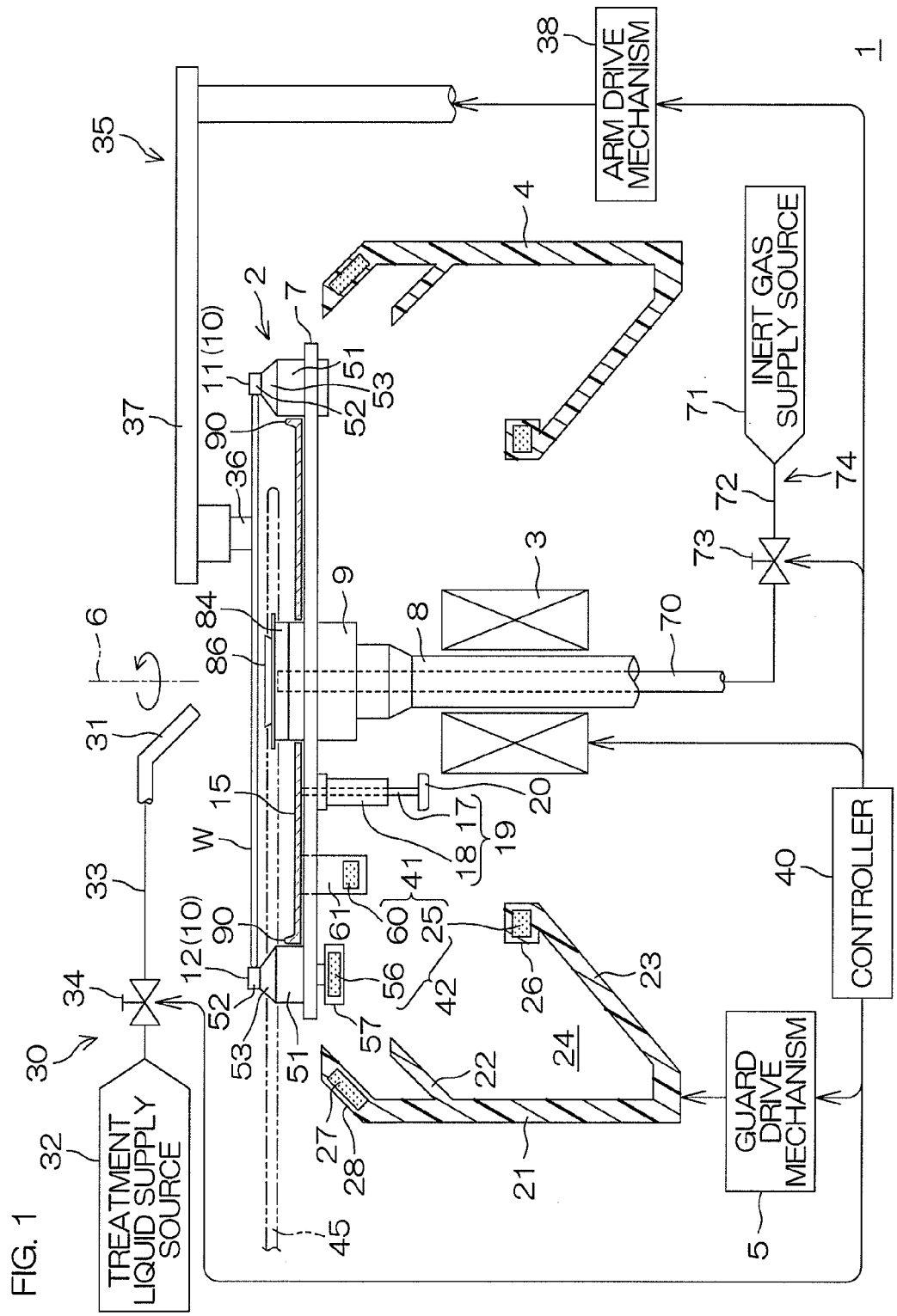
FIG. 1 is a schematic sectional view for explaining the construction of a substrate treatment apparatus according to a first embodiment of the present invention.

FIG. 1 is a schematic sectional view for explaining the construction of a substrate treatment apparatus according to a first embodiment of the present invention. The substrate treatment apparatus 1 is an apparatus of a single substrate treatment type adapted to treat a single substrate W (e.g., a semiconductor wafer or the like) at a time. The substrate treatment apparatus 1 includes a spin chuck 2, a rotative drive mechanism 3, a splash guard 4 and a guard drive mechanism 5.

The spin chuck 2 includes a turntable 7 rotatable about a vertical rotation axis 6. A rotation shaft 8 is connected to a lower surface of the turntable 7 at a rotation center via a boss 9. The rotation shaft 8 extends vertically, and is configured to receive a driving force from the rotative drive mechanism 3 to be rotated about the rotation axis 6. The rotative drive mechanism 3 may be, for example, an electric motor employing the rotation shaft 8 as a driving shaft. The spin chuck 2 further includes a plurality of holding pins 10 (six holding pins 10 in this embodiment) provided on an upper surface peripheral portion of the turntable 7 along a peripheral edge of the turntable 7 in spaced relation. The holding pins 10 are arranged to horizontally hold the substrate W at a substrate holding height position which is spaced a predetermined distance upward from the turntable 7 having a generally horizontal upper surface.

The spin chuck 2 further includes a protection disk 15 disposed between the upper surface of the turntable 7 and the substrate holding height position of the holding pins 10. The protection disk 15 is connected to the turntable 7 in a vertically movable manner, and is movable between a lower position close to the upper surface of the turntable 7 and an adjacent position spaced a minute distance from a lower surface of the substrate W held by the holding pins 10 in close relation to the lower surface of the substrate W above the lower position. The protection disk 15 has a disk shape having substantially the same size as the substrate W, and has notches provided at positions corresponding to the positions of the holding pins 10 to avoid the holding pins 10.

The splash guard 4 is a tubular member laterally surrounding the spin chuck 2, and serves as a receiving member which receives a treatment liquid flowing outward from the substrate W held by the spin chuck 2. More specifically, the splash guard 4 includes a cylindrical portion 21 coaxial about the rotation axis 6, an upper guide portion 22 and a lower guide portion 23 each projecting obliquely upward inward toward the rotation axis 6 from an interior wall of the cylindrical portion 21. The upper guide portion 22 has a partial conical surface, and its inner peripheral edge is spaced a predetermined distance outward from the spin chuck 2. The lower guide portion 23 is spaced a predetermined distance downward from the upper guide portion 22, and also has a partial conical surface. The lower guide portion 23 has an inner peripheral edge located inward of an outer peripheral edge of the spin chuck 2 as seen in plan. A treatment liquid port 24 is defined between the upper guide portion 22 and the lower guide portion 23 for receiving the treatment liquid flowing from the substrate W held by the spin chuck 2.

The guard drive mechanism 5 is provided for vertically moving up and down the splash guard 4 along the rotation axis 6. The guard drive mechanism 5 may include a linear drive mechanism such as an air cylinder or a ball screw mechanism.

The substrate treatment apparatus 1 further includes a treatment liquid supply unit 30 and a brush cleaning mechanism 35. The treatment liquid supply unit 30 includes a treatment liquid nozzle 31 which spouts a treatment liquid toward a front surface of the substrate W, and is configured to supply the treatment liquid from a treatment liquid supply source 32 to the treatment liquid nozzle 31 through a treatment liquid supply tube 33. A treatment liquid valve 34 is provided in the treatment liquid supply tube 33. Therefore, the spouting of the treatment liquid from the treatment liquid nozzle 31 is started and stopped by opening and closing the treatment liquid valve 34.

The brush cleaning mechanism 35 includes a cleaning brush 36 for scrubbing the substrate W in contact with an upper surface of the substrate W, a pivot arm 37 which holds the cleaning brush 36 at its distal end, and an arm drive mechanism 38 for driving the pivot arm 37. The arm drive mechanism 38 is arranged to pivot the pivot arm 37 in a horizontal plane and vertically move up and down the pivot arm 37. With this arrangement, the entire upper surface of the substrate W can be scrubbed by pressing the cleaning brush 36 to the upper surface of the substrate W and moving a brush pressing position radially of the substrate W while holding and rotating the substrate W by means of the spin chuck 2.

In this scrubbing process, the treatment liquid (e.g., deionized water) is supplied from the treatment liquid nozzle 31, whereby foreign matter can be easily removed from the front surface of the substrate W and foreign matter scrubbed away by the cleaning brush 36 can be expelled outside the substrate W.

The rotation shaft 8 is a hollow shaft, and an inert gas supply tube 70 is inserted in the inside of the hollow shaft. An inert gas supply line 72 for supplying an inert gas from an inert gas supply source 71 is connected to a lower end of the inert gas supply tube 70. An inert gas valve 73 is provided in the inert gas supply line 72. The inert gas valve 73 opens and closes the inert gas supply line 72. With the inert gas valve 73 open, the inert gas is supplied into the inert gas supply tube 70. The inert gas is supplied into a space defined between the protection disk 15 and the lower surface of the substrate W by an arrangement to be described later. Thus, the inert gas supply tube 70, the inert gas supply source 71, the inert gas supply line 72 and the inert gas valve 73 collectively define an inert gas supply unit 74.

The substrate treatment apparatus 1 includes a controller 40 for controlling the components of the apparatus. The controller 40 is configured to control the rotative drive mechanism 3, the guard drive mechanism 5, the treatment liquid valve 34, the arm drive mechanism 38, the inert gas valve 73 and the like.

Figure 2:
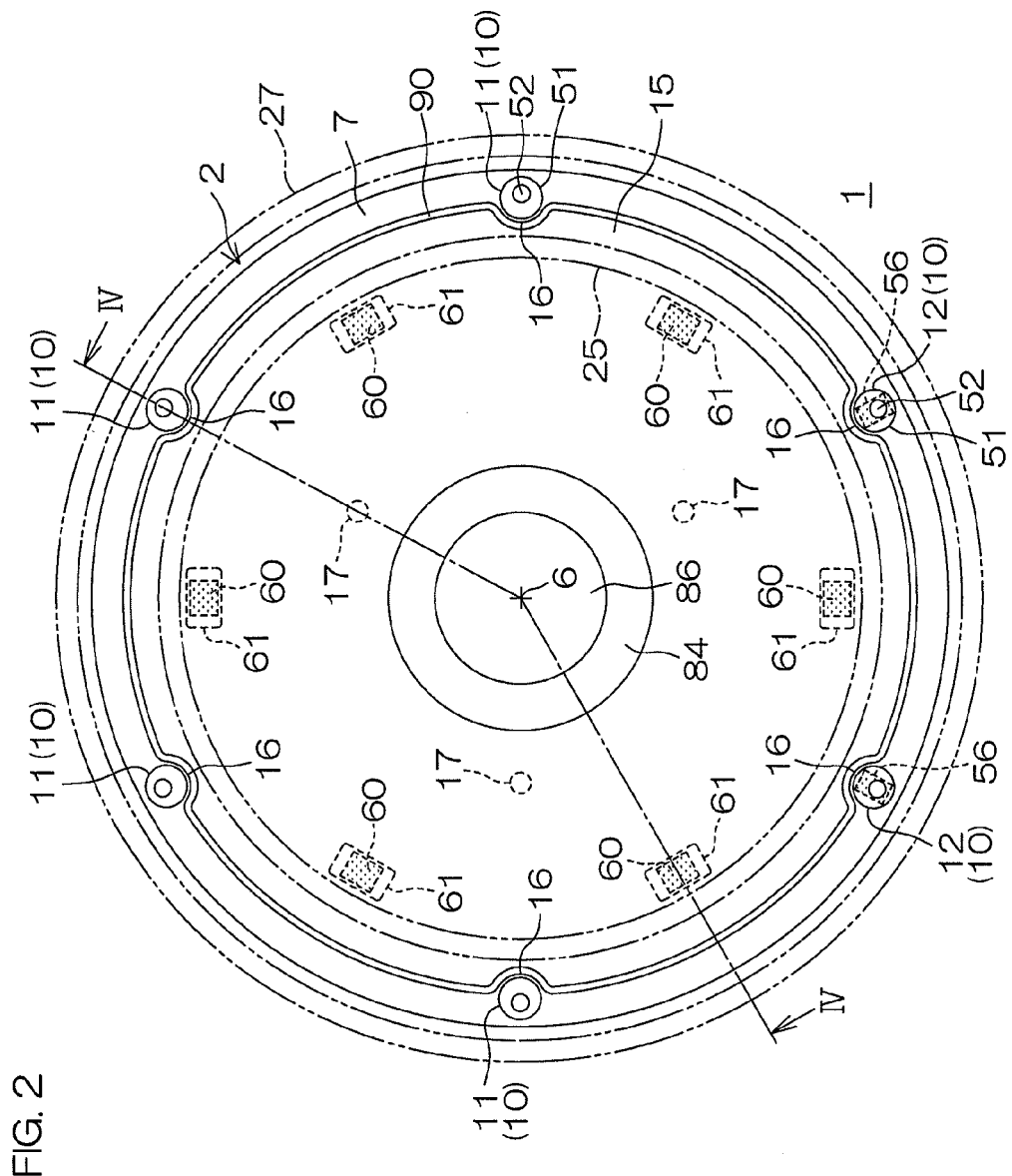
FIG. 2 is a plan view for explaining a specific structure of a spin chuck provided in the substrate treatment apparatus.
Figure 3:
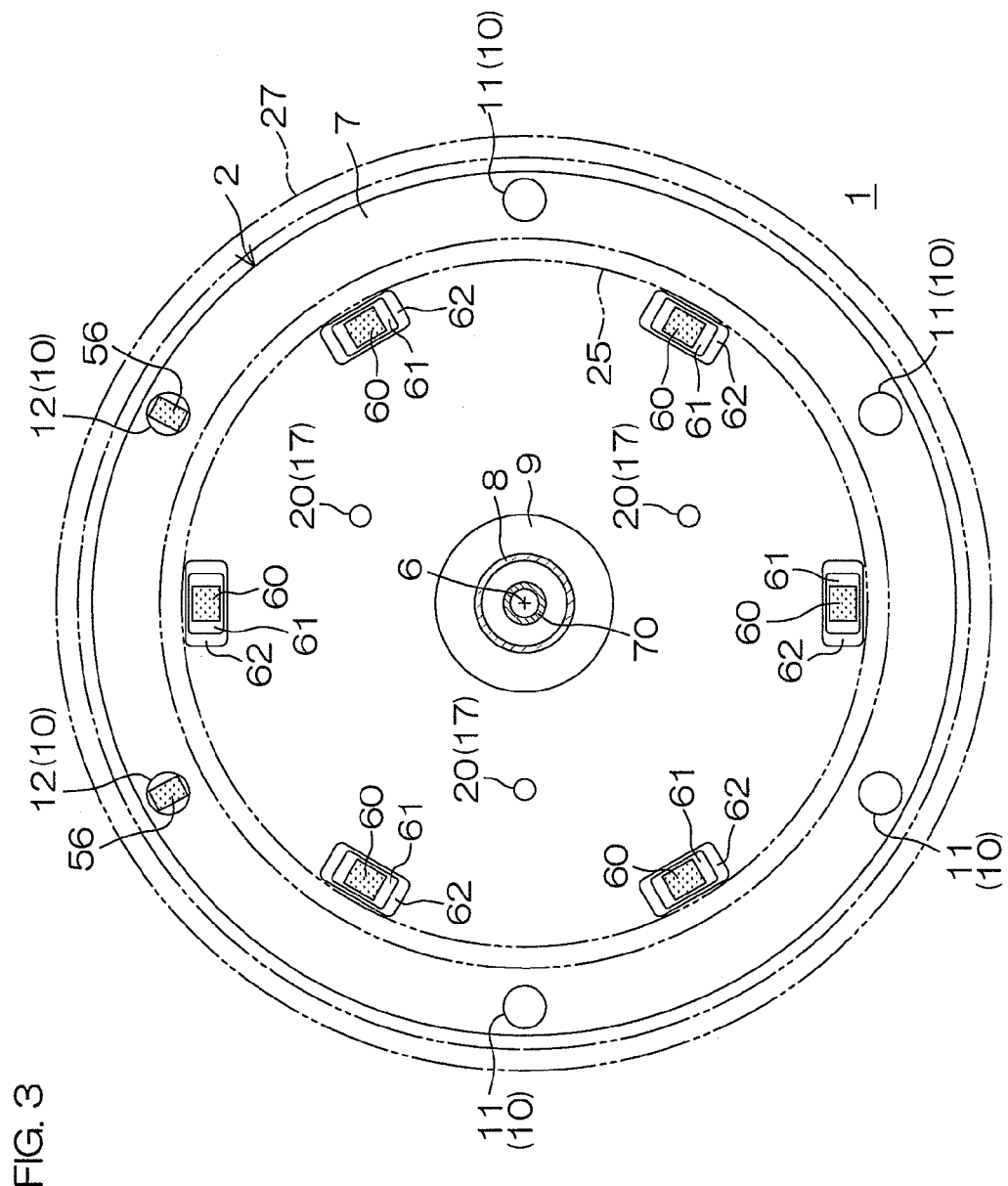
FIG. 3 is a bottom view of the structure of FIG. 2.
Figure 4:
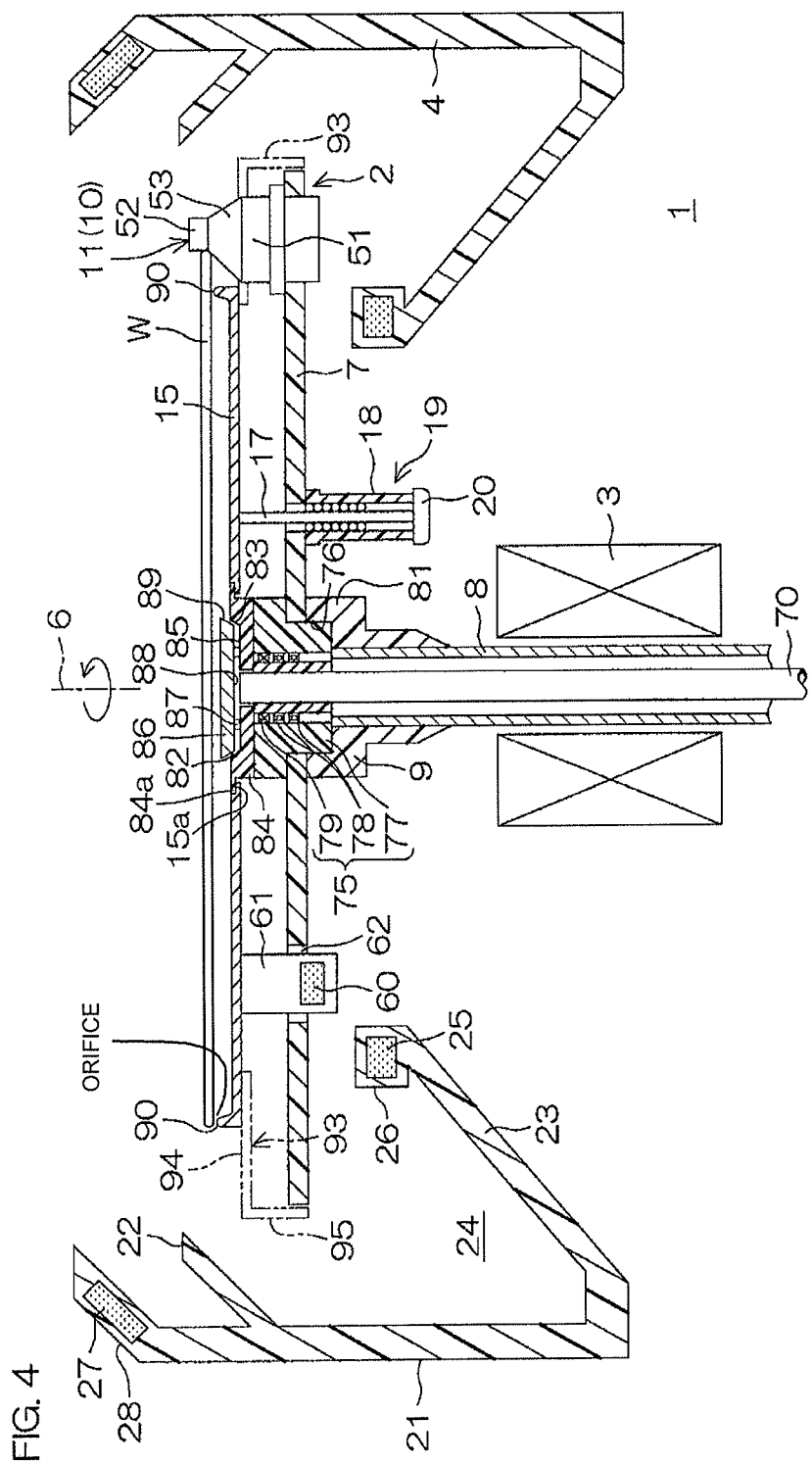
FIG. 4 is a sectional view taken along a sectional plane IV-IV in FIG. 2.

FIG. 2 is a plan view for explaining a specific structure of the spin chuck 2. FIG. 3 is a bottom view of the structure of FIG. 2, and FIG. 4 is a sectional view taken along a sectional plane IV-IV in FIG. 2.

The turntable 7 has a disk shape extending in a horizontal plane, and is connected to the boss 9 connected to the rotation shaft 8. The holding pins 10 are equidistantly arranged on the peripheral portion of the upper surface of the turntable 7 along the peripheral edge of the turntable 7. The holding pins 10 include stationary pins 11 which are immovable with respect to the turntable 7, and movable pins 12 which are movable with respect to the turntable 7. In this embodiment, two adjacent pins 10 serve as the movable pins 12. The holding pins 10 each include a lower shaft portion 51 connected to the turntable 7, and an upper shaft portion 52 provided on an upper end of the lower shaft portion 51 unitarily with the lower shaft portion 51. The lower shaft portion 51 and the upper shaft portion 52 each have a cylindrical shape. The upper shaft portion 52 is disposed eccentrically to a center axis of the lower shaft portion 51. The upper end of the lower shaft portion 51 and a lower end of the upper shaft portion 52 are connected to each other by a taper surface 53 which extends downward from a peripheral surface of the upper shaft portion 52 to a peripheral surface of the lower shaft portion 51.

Figure 5:
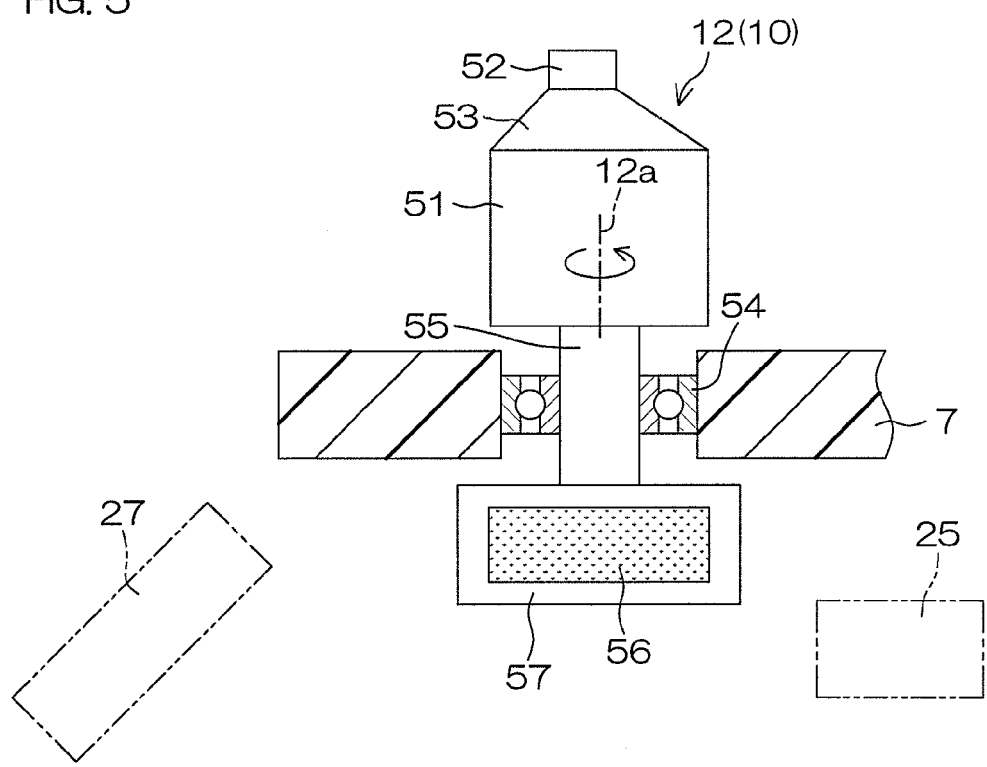
FIG. 5 is a sectional view showing an arrangement around a movable pin of the spin chuck.

As schematically illustrated in FIG. 5, the movable pins 12 are each connected to the turntable 7 so that the lower shaft portion 51 thereof is rotatable about a rotation axis 12a aligning with its center axis. More specifically, a support shaft 55 is provided at a lower end of the lower shaft portion 51 and supported via a bearing 54 by the turntable 7. A magnet retaining member 57 which retains a pin driving permanent magnet 56 is connected to a lower end of the support shaft 55. The pin driving permanent magnet 56 is disposed, for example, with its magnetic pole direction extending perpendicularly to the rotation axis 12a of the movable pin 12.

The protection disk 15 has a generally disk shape having substantially the same size as the substrate W. The protection disk 15 has notches 16 provided in a peripheral portion thereof at positions corresponding to the positions of the holding pins 10 as spaced a predetermined distance from the peripheral surfaces of the holding pins 10 to border the holding pins 10. The protection disk 15 further has a round opening conformal to the boss 9 in a center portion thereof.

Guide shafts 17 vertically extending parallel to the rotation axis 6 are connected to a lower surface of the protection disk 15 at positions more remote from the rotation axis 6 than the boss 9. In this embodiment, three guide shafts 17 are disposed equidistantly circumferentially of the protection disk 15. More specifically, the three guide shafts 17 are arranged at angular positions corresponding to every other holding pin 10 as seen along the rotation axis 6. The guide shafts 17 are respectively connected to linear bearings 18 provided at corresponding portions of the turntable 7. The guide shafts 17 are movable vertically, i.e., parallel to the rotation axis 6, while being guided by the linear bearings 18. Therefore, the guide shafts 17 and the linear bearings 18 collectively define a guide mechanism 19 which vertically guides the protection disk 15 parallel to the rotation axis 6.

The guide shafts 17 each extend through the linear bearing 18, and each have a flange 20 provided at a lower end thereof as projecting outward. With the flanges 20 in abutment against lower ends of the linear bearings 18, the upward movement of the guide shafts 17 and the upward movement of the protection disk 15 are limited. That is, the flanges 20 collectively define a limitation member which limits the upward movement of the protection disk.

Magnet retaining members 61 which each retain a protection disk permanent magnet 60 are fixed to the lower surface of the protection disk 15 at positions outwardly more remote from the rotation axis 6 than the guide shafts 17 and inwardly closer to the rotation axis 6 than the holding pins 10. In this embodiment, the protection disk permanent magnet 60 is retained in the magnet retaining member 61 with its magnetic pole direction extending vertically. For example, the protection disk permanent magnet 60 may be fixed to the magnet retaining member 61 so as to have an S-pole at its lower end and an N-pole at its upper end. In this embodiment, six magnet retaining members 61 are arranged in circumferentially equidistantly spaced relation. More specifically, the magnet retaining members 61 are respectively disposed at angular positions between adjacent holding pins 10 (intermediate between adjacent holding pins 10 in this embodiment) as seen along the rotation axis 6. The protection disk 15 is divided (equally divided in this embodiment) into six angular regions defined by the six magnet retaining members 61 about the rotation axis 6, and the three guide shafts 17 are disposed in every other angular region (at the center of every other angular region in this embodiment).

The turntable 7 has six through-holes 62 formed at positions corresponding to the six magnet retaining members 61. The through-holes 62 are configured so that the corresponding magnet retaining members 61 are inserted through the through-holes 62 vertically parallel to the rotation axis 6. With the protection disk 15 located at the lower position, as shown in FIG. 1, the magnet retaining members 61 respectively inserted through the through-holes 62 to project downward from the lower surface of the turntable 7, so that the protection disk permanent magnets 60 are located below the lower surface of the turntable 7.

The lower guide portion 23 of the splash guard 4 includes a magnet retaining portion 26 which retains a guard permanent magnet 25 provided in an upper edge portion (inner edge portion) thereof. The guard permanent magnet 25 has an annular shape coaxial about the rotation axis 6, and is disposed in a plane (horizontal plane) perpendicular to the rotation axis 6. More specifically, the guard permanent magnet 25 is disposed more remote from the rotation axis 6 than the protection disk permanent magnets 60 and closer to the rotation axis 6 than the pin driving permanent magnets 56. That is, the annular guard permanent magnet 25 is positioned between the protection disk permanent magnets 60 and the pin driving permanent magnets 56 as seen in plan. The guard permanent magnet 25 is disposed at a lower position than the protection disk permanent magnets 60. In this embodiment, the guard permanent magnet 25 has a magnetic pole direction extending horizontally, i.e., extending radially about the rotation axis of the turntable 7. Where the protection disk permanent magnets 60 each have an S-pole in a lower surface thereof, the guard permanent magnet 25 is configured so as to have a magnetic pole having the same polarity (i.e., to have a ring-shaped S-pole) on a radially inward edge thereof about the rotation axis.

When the splash guard 4 is located at a treatment position (see FIG. 4) at which the treatment liquid flowing outward from the substrate W is received, the treatment liquid port 24 defined between the upper guide portion 22 and the lower guide portion 23 is horizontally opposed to the substrate W. With the splash guard 4 located at the treatment position, a radially outward ring-shaped magnetic pole of the guard permanent magnet 25 is horizontally opposed to the pin driving permanent magnets 56. Thus, a magnetic force is generated between the guard permanent magnet 25 and the pin driving permanent magnets 56, whereby the movable pins 12 are moved to a holding position and held at the holding position.

As described above, the upper shaft portions 52 of the movable pins 12 are each eccentric to the rotation axis 12a (see FIG. 5). Therefore, the upper shaft portions 52 are each shifted between an open position more remote from the rotation axis 6 and a holding position closer to the rotation axis 6 by the rotation of the lower shaft portions 51. When the pin driving permanent magnets 56 receive an attractive magnetic force from the guard permanent magnet 25, the pin driving permanent magnets 56 are each moved to the holding position at which the upper shaft portions 52 are located closer to the rotation axis 6. Since the guard permanent magnet 25 has an annular shape coaxial about the rotation axis 6, the attractive magnetic force is generated between the guard permanent magnet 25 and the pin driving permanent magnets 56 irrespective of the rotational angular positions of the movable pins 12 about the rotation axis 6 during the rotation of the turntable 7. Thus, the movable pins 12 are each held at the holding position at which the substrate W is held.

On the other hand, a repulsive magnetic force acts between the guard permanent magnet 25 and the protection disk permanent magnets 60 when the splash guard 4 is located at the treatment position (see FIG. 4). Therefore, the protection disk permanent magnets 60 receive an upward external force. Thus, the protection disk 15 receives an upward force from the magnet retaining members 61 respectively retaining the protection disk permanent magnets 60 to be thereby held at the treatment position or adjacent position close to the lower surface of the substrate W.

When the splash guard 4 is moved down to be retracted to a retracted position from a lateral side of the spin chuck 2, a smaller repulsive magnetic force acts between the guard permanent magnet 25 and the protection disk permanent magnets 60. Therefore, the protection disk 15 is held at the lower position close to the upper surface of the turntable 7 by its gravity. Further, the guard permanent magnet 25 is not opposed to the pin driving permanent magnets 56, so that no external force acts on the movable pins 12 for biasing the movable pins 12 to the holding position.

In this embodiment, the splash guard 4 includes a magnet retaining portion 28 provided above the upper guide portion 22 and retaining a cancelation permanent magnet 27. When the splash guard 4 is located at the lower position or retracted position, the cancelation permanent magnet 27 is opposed to the pin driving permanent magnets 56. The cancelation permanent magnet 27 has an annular shape coaxial about the rotation axis 6, and has a ring-shaped magnetic pole provided on a radially inward edge thereof about the rotation axis of the turntable 7. The radially inward magnetic pole of the cancelation permanent magnet 27 has the same polarity as the radially outward magnetic pole of the guard permanent magnet 25. The cancelation permanent magnet 27 generates a magnetic force which acts on the pin driving permanent magnets 56 to rotate the movable pins 12 to the open position. Where the guard permanent magnet 25 has a ring-shaped N-pole on the outer edge thereof, more specifically, the cancelation permanent magnet 27 is configured to have a ring-shaped N-pole on the inner edge thereof.

When the splash guard 4 is located at the lower position or retracted position, the protection disk 15 is located at the lower position close to the upper surface of the turntable 7, and the movable pins 12 are held at the open position. In this state, a substrate transport robot which loads and unloads a substrate W to/from the spin chuck 2 can move its substrate holding hand 45 into a space defined between the protection disk 15 and the lower surface of the substrate W.

The protection disk permanent magnets 60, the guard permanent magnet 25 and the guard drive mechanism 5 which moves up and down the splash guard 4 collectively define a magnetic levitation mechanism 41 which levitates the protection disk 15 upward from the upper surface of the turntable 7 by the repulsive force generated between the permanent magnet 25 and the permanent magnets 60. Further, the pin driving permanent magnets 56, the guard permanent magnet 25 and the guard drive mechanism 5 collectively define a magnetic drive mechanism 42 which holds the movable pins 12 at the holding position by the magnetic force generated between the permanent magnet 25 and the permanent magnets 56.

That is, the magnetic levitation mechanism 41 and the magnetic drive mechanism 42 share the guard permanent magnet 25, the splash guard 4 serving as a support member which supports the guard permanent magnet 25, and the guard drive mechanism 5 which moves up and down the splash guard 4. When the splash guard 4 is located at the treatment position, the protection disk 15 is held at the adjacent position by the magnetic repulsive force generated between the guard permanent magnet 25 and the protection disk permanent magnets 60, and the movable pins 12 are held at the holding position by the magnetic attractive force generated between the guard permanent magnet 25 and the pin driving permanent magnets 56.

Figure 4A:
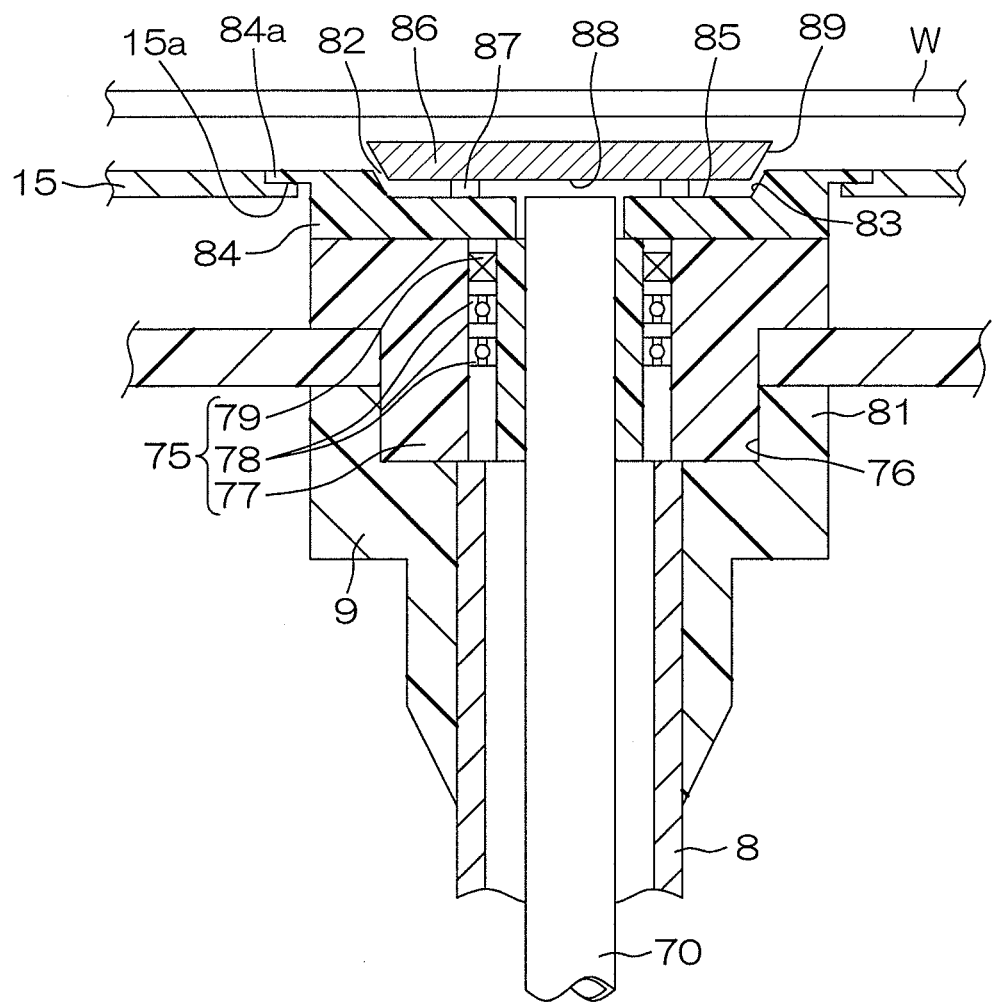
FIG. 4A is an enlarged sectional view showing a part of the structure of FIG. 4 on an enlarged scale.

As illustrated on a larger scale in FIG. 4A, the boss 9 connected to the upper end of the rotation shaft 8 supports a bearing mechanism 75 for supporting an upper end portion of the inert gas supply tube 70. The bearing mechanism 75 includes a spacer 77 fitted and fixed in a recess 76 formed in the boss 9, bearings 78 provided between the spacer 77 and the inert gas supply tube 70, and a magnetic fluid bearing 79 provided between the spacer 77 and the inert gas supply tube 70 above the bearings 78.

The boss 9 unitarily includes a flange 81 projecting outward in a horizontal plane, and the turntable 7 is connected to the flange 81. The spacer 77 is fixed to the flange 81 so as to hold an inner peripheral edge portion of the turntable 7 between the spacer 77 and the flange 81, and a cover 84 is connected to the spacer 77. The cover 84 has a generally disk shape. The cover 84 has a center opening through which the upper end of the inert gas supply tube 70 is exposed, and a recess 85 provided in an upper surface thereof with the center opening formed in a bottom of the recess 85. The recess 85 has a horizontal bottom surface, and an inclined surface 83 having an inverted partial conical shape and extending from a peripheral edge of the bottom surface obliquely outward upward. A rectification member 86 is connected to the bottom surface of the recess 85. The rectification member 86 has a plurality of legs 87 (e.g., four legs 87) circumferentially discretely provided in spaced relation about the rotation axis 6, and a bottom surface 88 spaced from the bottom surface of the recess 85 by the legs 87. The rectification member 86 has an inclined surface 89 having an inverted partial conical shape and extending from a peripheral edge of the bottom surface 88 obliquely outward upward.

The cover 84 has a flange 84a projecting outward from an outer peripheral edge of the upper surface thereof. The flange 84a is configured to be fitted with a step 15a formed on an inner peripheral edge of the protection disk 15. That is, when the protection disk 15 is located at the adjacent position close to the lower surface of the substrate W, the flange 84a is fitted with the step 15a, so that the upper surface of the cover 84 and the upper surface of the protection disk 15 are flush with each other to form a flat inert gas flow passage.

With this arrangement, the inert gas flowing out from the upper end of the inert gas supply tube 70 flows into a space defined by the bottom surface 88 of the rectification member 86 in the recess 85 of the cover 84. The inert gas is ejected radially away from the rotation axis 6 through a radial flow passage 82 defined between the inclined surface 83 of the recess 85 and the inclined surface 89 of the rectification member 86. The inert gas forms an inert gas stream in the space defined between the protection disk 15 and the lower surface of the substrate W held by the holding pins 10, and is ejected from the space radially outward of the substrate W about the rotation axis.

The protection disk 15 has a restriction portion 90 provided on the upper surface thereof for restricting the inert gas flow passage on a peripheral edge of the substrate W held by the holding pins 10. In this embodiment, the restriction portion 90 is a linear projection projecting upward from the peripheral edge of the protection disk 15. With this arrangement, the inert gas stream ejected outward from the space defined between the protection disk 15 and the lower surface of the substrate W has a higher flow speed, thereby reliably preventing or substantially preventing an ambient atmosphere (particularly the treatment liquid mist) from intruding into the space below the lower surface of the substrate W.

Figure 6:
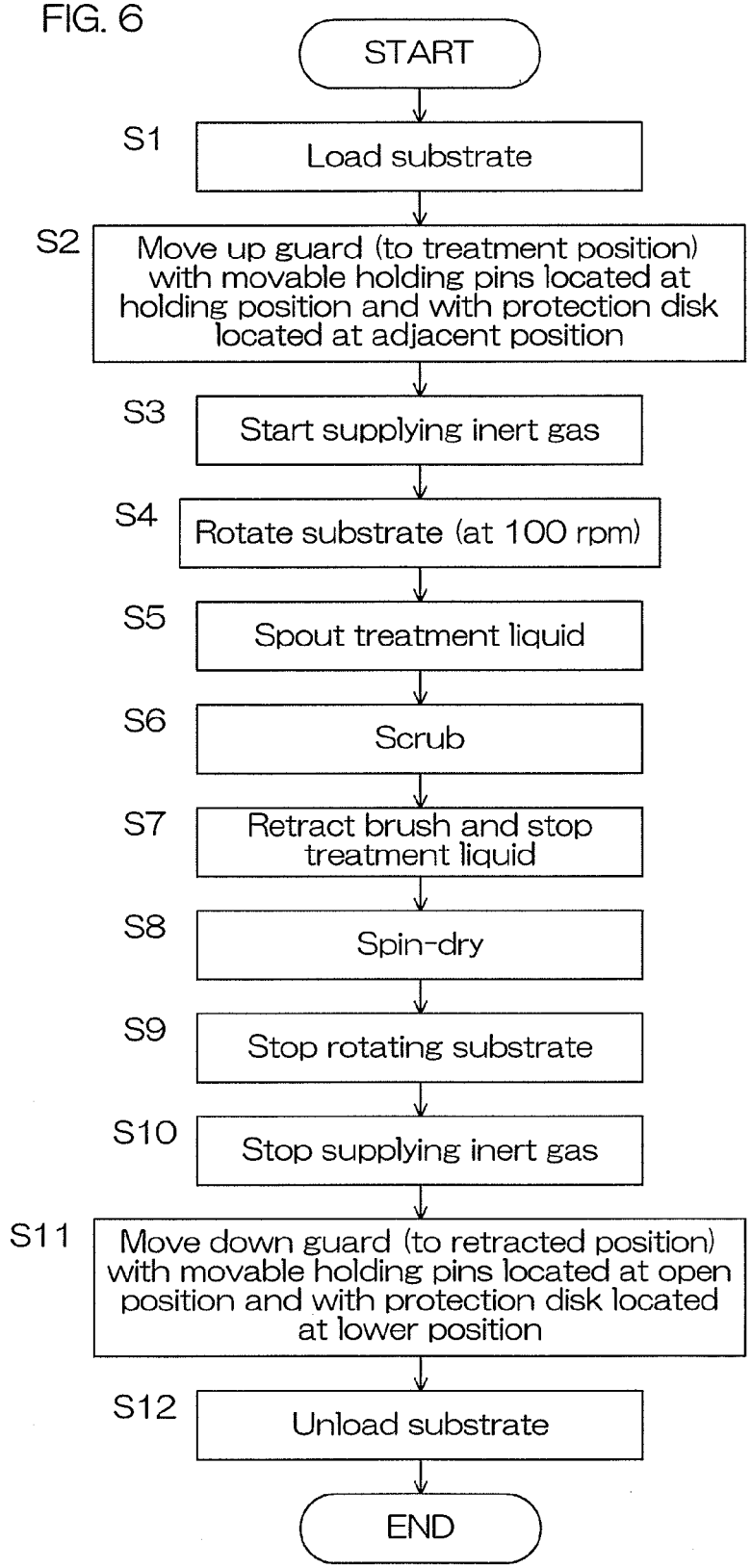
FIG. 6 is a flow chart for explaining an exemplary operation to be performed by the substrate treatment apparatus.

FIG. 6 is a flow chart for explaining an exemplary operation to be performed by the substrate treatment apparatus 1. A substrate W to be treated is loaded into the substrate treatment apparatus 1 by the substrate holding hand 45 of the substrate transport robot, and transferred to the spin chuck 2 (Step S1). At this time, the splash guard 4 is located at the retracted position or lower position below the lateral side of the spin chuck 2. Therefore, the cancelation permanent magnet 27 is opposed to the pin driving permanent magnets 56, so that the movable pins 12 are held at the open position. Since the guard permanent magnet 25 retained in the lower guide portion 23 of the splash guard 4 is located downwardly away from the turntable 7, a smaller repulsive magnetic force acts between the guard permanent magnet 25 and the protection disk permanent magnets 60. Therefore, the protection disk 15 is located at the lower position close to the upper surface of the turntable 7. Therefore, the space defined between the substrate holding height position of the holding pins 10 and the upper surface of the protection disk 15 is sufficient to receive the substrate holding hand 45.

The substrate holding hand 45 holds the substrate W at a position higher than the upper ends of the holding pins 10 and, in this state, transports the substrate W to above the spin chuck 2. Thereafter, the substrate holding hand 45 is moved down toward the upper surface of the turntable 7. During this downward movement, the substrate W is transferred from the substrate holding hand 45 to the holding pins 10. The substrate holding hand 45 is further moved down to the space defined between the lower surface of the substrate W and the protection disk 15, and then retracted laterally of the spin chuck 2 through a space defined between the two adjacent holding pins 10.

In turn, the controller 40 controls the guard drive mechanism 5 to move up the splash guard 4 to the treatment position (Step S2). Thus, the treatment liquid port 24 defined between the upper guide portion 22 and the lower guide portion 23 is opposed to the spin chuck 2, more specifically to the substrate W, from the lateral side. Further, the annular guard permanent magnet 25 retained in the inner peripheral edge portion of the lower guide portion 23 is opposed to the pin driving permanent magnets 56. Thus, the movable pins 12 are driven to be moved from the open position to the holding position, and held at the holding position. In this manner, the substrate W is held by the stationary pins 11 and the movable pins 12. In the upward movement of the splash guard 4 to the treatment position, the guard permanent magnet 25 is moved toward the protection disk permanent magnets 60 from the lower side, so that distances between the permanent magnet 25 and the permanent magnets 60 are reduced. Thus, a repulsive magnetic force is correspondingly increased. The repulsive magnetic force levitates the protection disk 15 from the upper surface of the turntable 7 toward the substrate W. Before the splash guard 4 reaches the treatment position, the protection disk 15 reaches the adjacent position spaced the minute distance from the lower surface of the substrate W in close relation to the lower surface of the substrate W, whereby the flanges 20 provided at the lower ends of the guide shafts 17 respectively abut against the linear bearings 18. Thus, the protection disk 15 is held at the adjacent position.

In this state, the controller 40 opens the inert gas valve 73 to start supplying the inert gas (Step S3). The supplied inert gas is spouted from the upper end of the inert gas supply tube 70, and ejected radially about the rotation axis 6 toward the narrow space defined between the lower surface of the substrate W and the protection disk 15 located at the adjacent position by the action of the rectification member 86 and the like. The inert gas is accelerated by an orifice defined between the restriction portion 90 provided on the peripheral edge of the protection disk 15 and the peripheral edge of the lower surface of the substrate W to form a gas stream which is ejected at a higher flow speed laterally of the substrate W.

The controller 40 further controls the rotation drive mechanism 3 to start rotating the turntable 7, whereby the substrate W is rotated about the rotation axis 6 (Step S4). The rotation speed may be, for example, about 100 rpm. In this state, the controller 40 opens the treatment liquid valve 34. Thus, the treatment liquid is supplied from the treatment liquid nozzle 31 toward the upper surface of the substrate W (Step S5). The supplied treatment liquid receives a centrifugal force on the upper surface of the substrate W to spread outward over the entire surface of the substrate W. The treatment liquid flowing outward from the substrate W by the centrifugal force is received by the splash guard 4 to be drained. On the other hand, the controller 40 controls the arm drive mechanism 38 to cause the brush cleaning mechanism 35 to perform a scrub-cleaning process on the upper surface of the substrate W (Step S6). Thus, the upper surface of the substrate W is scrubbed with the cleaning brush 36 while the treatment liquid is supplied.

During the substrate treatment, the lower surface of the substrate W is covered with the protection disk 15. In addition, the outward inert gas stream is formed in the space defined between the protection disk 15 and the lower surface of the substrate W, so that the inert gas is ejected outward at a higher flow speed. Even if the treatment liquid mist scatters around the spin chuck 2, the mist is substantially prevented from adhering to the lower surface of the substrate W. This makes it possible to selectively perform the scrub-cleaning process on the upper surface of the substrate W, while preventing or suppressing the adhesion of the treatment liquid mist to the lower surface of the substrate W with the lower surface of the substrate W kept in a dry state without performing a back rinsing process on the lower surface of the substrate W.

After the scrub-cleaning process, the controller 40 controls the arm drive mechanism 38 to retract the cleaning brush 36 from above the spin chuck 2 to the lateral side, and closes the treatment liquid valve 34 to stop spouting the treatment liquid from the treatment liquid nozzle 31 (Step S7). Further, the controller 40 controls the rotative drive mechanism 3 to increase the rotation speed of the turntable 7. Thus, a spin-drying process is performed to spin out liquid droplets from the upper surface and the peripheral surface of the substrate W by a centrifugal force to dry the substrate W (Step S8). The rotation speed of the substrate W for the spin-drying process is, for example, 1500 to 3000 rpm.

After the spin-drying process is performed for a predetermined period of time, the controller 40 controls the rotative drive mechanism 3 to stop rotating the substrate W (Step S9). Further, the controller 40 closes the inert gas valve 73 to stop supplying the inert gas (Step S10). Then, the controller 40 controls the guard drive mechanism 5 to move down the splash guard 4 to the lower retracted position (Step S11). In the downward movement of the splash guard 4, the distances between the guard permanent magnet 25 and the protection disk permanent magnets 60 are increased, so that the magnetic repulsive force generated between the guard permanent magnet 25 and the protection disk permanent magnets 60 is reduced. Accordingly, the protection disk 15 is guided by the guide mechanism 19 to be moved down toward the upper surface of the turntable 7 by its gravity. Thus, a space sufficient to receive the substrate holding hand 45 of the substrate transport robot is defined between the upper surface of the protection disk 15 and the lower surface of the substrate W. On the other hand, the guard permanent magnet 25 is not opposed to the pin driving permanent magnets 56, so that the external force for biasing the movable pins 12 to the holding position is lost. Instead, the cancelation permanent magnet 27 is opposed to the pin driving permanent magnets 56, whereby the movable pins 12 are biased to the open position. Thus, the substrate W is released.

Subsequently, the controller 40 controls the substrate transport robot to insert the substrate holding hand 45 into the space defined between the protection disk 15 and the lower surface of the substrate W. Then, the substrate holding hand 45 lifts the substrate W from the holding pins 10 and, in this state, is retracted laterally of the spin chuck 2. Thus, the treated substrate W is unloaded (Step S12).

According to this embodiment, as described above, the guard permanent magnet 25 retained in the splash guard 4 has an annular shape coaxial about the rotation axis 6. Therefore, the guard permanent magnet 25 is constantly opposed to the pin driving permanent magnets 56, and continuously applies a sufficient magnetic repulsive force to the protection disk permanent magnets 60 during the rotation of the turntable 7. Thus, the external force for biasing the movable pins 12 to the holding position and the external force for holding the protection disk 15 at the adjacent position close to the lower surface of the substrate W can be applied from the guard permanent magnet 25 provided in a non-rotation system in a non-contact state during the rotation of the turntable 7. In addition, the driving force is not provided by utilizing the rotation of the turntable 7. Therefore, even if the substrate W is rotated at a lower rotation speed in the scrub-cleaning process or the rotation of the substrate W is stopped, the movable pins 12 provide a sufficient substrate holding force, and the protection disk 15 is reliably kept at the adjacent position. This makes it possible to treat the upper surface of the substrate W while reliably preventing or suppressing the adhesion of the treatment liquid mist to the lower surface of the substrate W.

In this embodiment, the magnetic levitation mechanism 41 adapted to levitate the protection disk 15 above the turntable 7 and the magnetic drive mechanism 42 adapted to drive the movable pins 12 share the guard permanent magnet 25 retained in the splash guard 4. Thus, the guard drive mechanism 5 for moving up and down the splash guard 4 can be shared as a drive source for the magnetic levitation mechanism 41 and the magnetic drive mechanism 42, significantly simplifying the construction of the apparatus. Further, the magnetic levitation mechanism 41 and the magnetic drive mechanism 42 incorporate no driving unit in a rotation system rotatable together with the turntable 7 and, therefore, each have a simplified structure. This further simplifies the construction of the substrate treatment apparatus 1. Further, the magnetic levitation mechanism 41 and the magnetic drive mechanism 42 are each configured to transmit the driving force from the non-rotation system to the rotation system in a non-contact manner, eliminating the frictional contact in a driving force transmission path during the rotation of the turntable 7. This makes it possible to perform the substrate treatment process with higher cleanliness, while suppressing the generation of particles.

In this embodiment, the inert gas is supplied into the space defined between the protection disk 15 located at the adjacent position and the lower surface of the substrate W, thereby more effectively preventing or suppressing the adhesion of the treatment liquid mist to the lower surface of the substrate W. Since the inert gas is ejected radially from the rotation axis 6 toward the outer peripheral edge of the substrate W by the action of the rectification member 86 and the like, the inert gas stream flowing outward can be stably formed between the lower surface of the substrate W and the protection disk 15. This more effectively prevents or suppresses the adhesion of the treatment liquid mist to the lower surface of the substrate W. With the provision of the restriction portion 90 on the outer peripheral edge of the protection disk 15, the inert gas stream flowing outward at a higher flow speed can be formed in the vicinity of the outer peripheral edge of the substrate W. This further effectively prevents or suppresses the intrusion of the treatment liquid mist into the space defined between the protection disk 15 and the lower surface of the substrate W.

Figure 7:
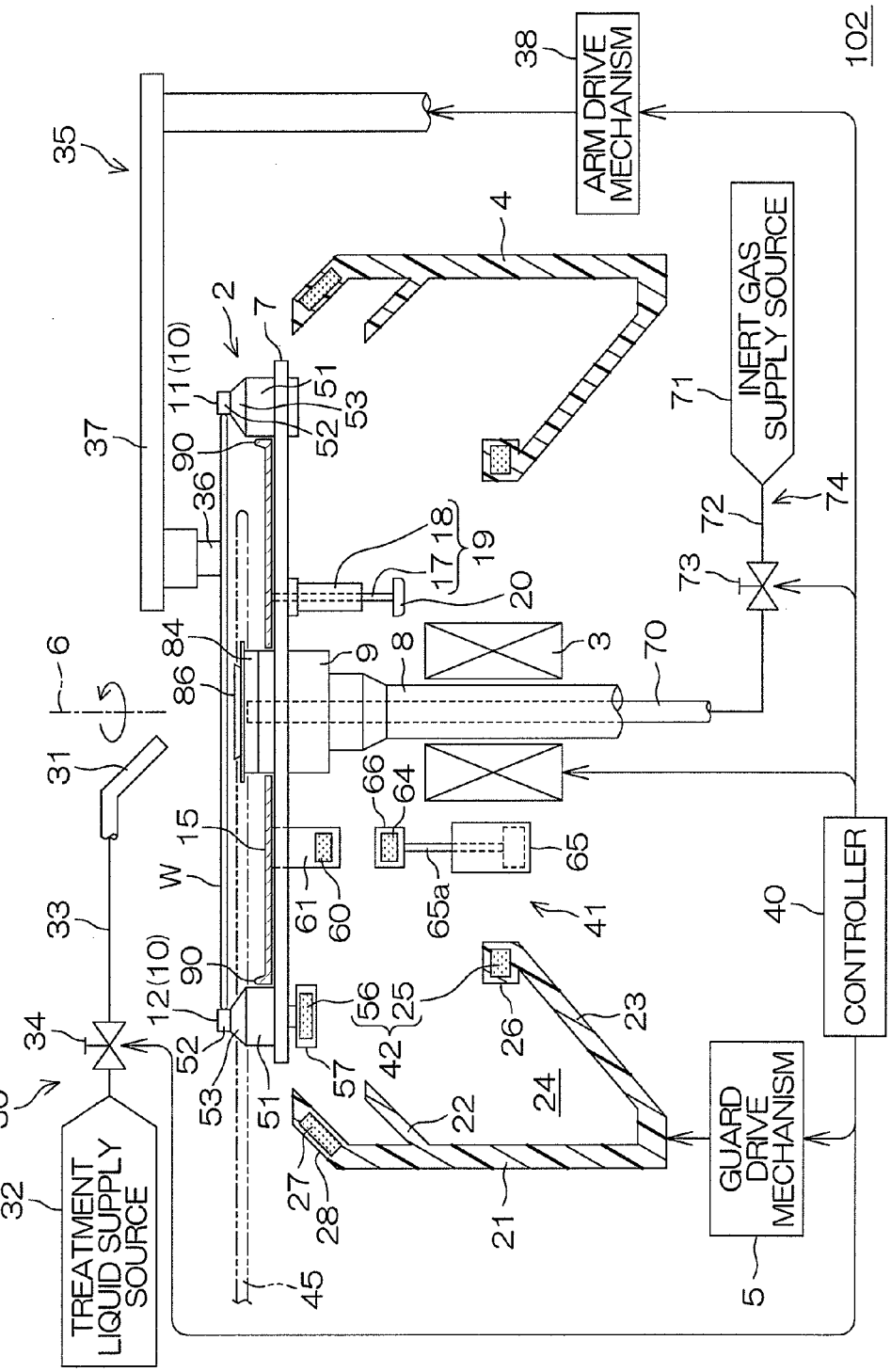
FIG. 7 is a schematic sectional view for explaining the construction of a substrate treatment apparatus according to a second embodiment of the present invention.

FIG. 7 is a schematic sectional view for explaining the construction of a substrate treatment apparatus 102 according to a second embodiment of the present invention. In FIG. 7, components corresponding to those shown in FIG. 1 are designated by the same reference characters as in FIG. 1. Although the guard drive mechanism 5 for moving up and down the splash guard 4 is shared as the drive source for the magnetic levitation mechanism 41 and the magnetic drive mechanism 42 in the first embodiment, a drive source dedicated for the magnetic levitation mechanism 41 is provided in the second embodiment.

In the second embodiment, more specifically, the magnetic levitation mechanism 41 includes protection disk permanent magnets 60, a disk lifting permanent magnet 64 and a lift actuator 65. The disk lifting permanent magnet 64 is an annular permanent magnet piece disposed in a horizontal plane about the rotation axis 6, and has an annular magnetic pole opposed to the protection disk permanent magnets 60 from a lower side. The magnetic pole has the same polarity as lower magnetic poles of the protection disk permanent magnets 60. Therefore, the disk lifting permanent magnet 64 generates an upward repulsive magnetic force with respect to the protection disk permanent magnets 60. The disk lifting permanent magnet 64 is incorporated and retained in an annular magnet retaining member 66. An actuation shaft 65a of the lift actuator 65 is connected to the magnet retaining member 66.

The lift actuator 65 is, for example, an air cylinder, which is configured to move up and down the actuator shaft 65a parallel to the rotation axis 6. The operation of the lift actuator 65 is controlled by the controller 40. Thus, the lift actuator 65 can locate the disk lifting permanent magnet 64 at an upper position and at a lower position. The lower position is set so that the disk lifting permanent magnet 64 is located at a position sufficiently lower than the turntable 7 and distances between the disk lifting permanent magnet 64 and the protection disk permanent magnets 60 are sufficient to reduce a magnetic repulsive force between the disk lifting permanent magnet 64 and the protection disk permanent magnets 60 to smaller than the gravity acting on the protection disk 15. The upper position is set higher than the lower position so that the protection disk 15 connected to the magnet retaining members 61 can be moved up to the adjacent position (treatment height position) close to the lower surface of the substrate W by a magnetic repulsive force generated between the disk lifting permanent magnet 64 and the protection disk permanent magnets 60.

Therefore, when the lift actuator 65 is actuated to move up the disk lifting permanent magnet 64 from the lower position to the upper position, the magnetic repulsive force generated between the disk lifting permanent magnet 64 and the protection disk permanent magnets 60 surpasses the gravity acting on the protection disk 15 and other lift resistance (frictional force and the like) in the upward movement of the disk lifting permanent magnet 64. Thus, the protection disk 15 is levitated from the upper surface of the turntable 7 to be moved up to the adjacent position (treatment height position) close to the lower surface of the substrate W. The flanges 20 provided at the lower ends of the guide shafts 17 are brought into abutment against the lower ends of the linear bearings 18 to limit the upward movement of the protection disk 15. On the other hand, when the lift actuator 65 is actuated to move down the disk lifting permanent magnet 64 from the upper position to the lower position, the gravity acting on the protection disk 15 surpasses the magnetic repulsive force generated between the disk lifting permanent magnet 64 and the protection disk permanent magnets 60 and other downward movement resistance (frictional force and the like) in the downward movement of the disk lifting permanent magnet 64. Thus, the protection disk 15 is moved down from the adjacent position close to the lower surface of the substrate W to reach the turntable 7.

In the second embodiment, the magnetic levitation mechanism 41 thus includes the dedicated disk lifting permanent margent 64, and the dedicated lift actuator 65 which moves up and down the disk lifting permanent magnet 64. This makes it possible to move up and down the protection disk 15 independently of the vertical movement of the splash guard 4 and the driving of the movable pins 12. Therefore, where the splash guard 4 includes a plurality of treatment liquid ports which are provided in vertically stacked relation to be selectively used according to the type of the treatment liquid, for example, the protection disk 15 can be held at the adjacent position irrespective of the selective use of the treatment liquid ports.

Figure 8:
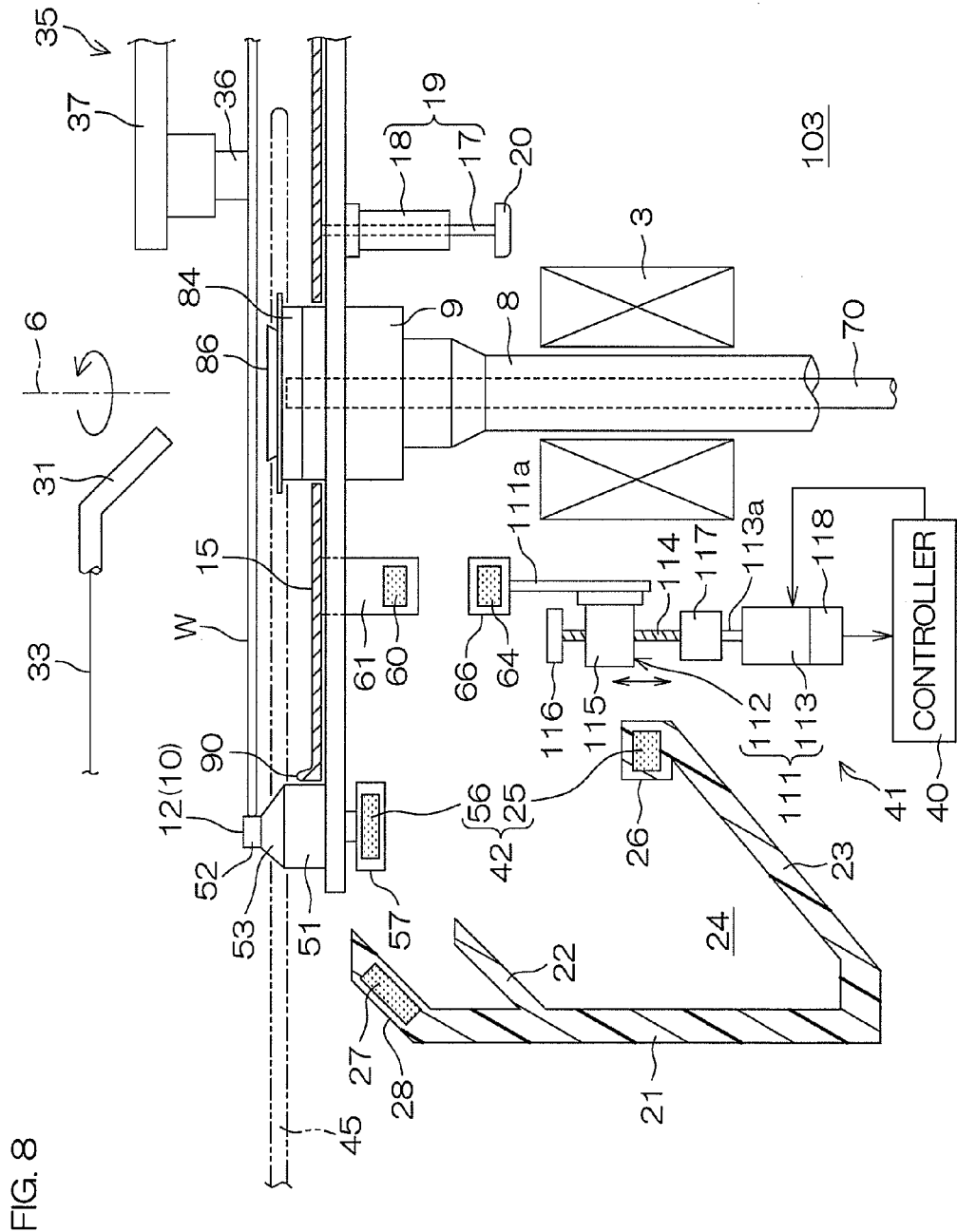
FIG. 8 is a schematic sectional view for explaining the construction of a substrate treatment apparatus according to a third embodiment of the present invention.

FIG. 8 is a schematic sectional view for explaining the construction of a substrate treatment apparatus 103 according to a third embodiment of the present invention. In FIG. 8, components corresponding to those shown in FIG. 7 are designated by the same reference characters as in FIG. 7. In the third embodiment, a drive source dedicated for the magnetic levitation mechanism 41 is provided as in the second embodiment.

In the third embodiment, the magnetic levitation mechanism 41 includes protection disk permanent magnets 60, a disk lifting permanent magnet 64 and a lift actuator 111. The disk lifting permanent magnet 64 is an annular permanent magnet piece disposed in a horizontal plane about the rotation axis 6, and has an annular magnetic pole opposed to the protection disk permanent magnets 60 from a lower side. The magnetic pole has the same polarity as lower magnetic poles of the protection disk permanent magnets 60. Therefore, the disk lifting permanent magnet 64 generates an upward repulsive magnetic force with respect to the protection disk permanent magnets 60. The disk lifting permanent magnet 64 is incorporated and retained in an annular magnet retaining member 66. An actuation member 111a of the lift actuator 111 is connected to the magnet retaining member 66.

The lift actuator 111 includes a ball screw mechanism 112 and an electric motor 113, and is configured to vertically move up and down the actuation member 111a parallel to the rotation axis 6. The ball screw mechanism 112 includes a screw shaft 114 disposed vertically parallel to the rotation axis 6, and a ball nut 115 threadingly engaged with the screw shaft 114. The actuation member 111a is connected to the ball nut 115. The screw shaft 114 has an upper end supported by a bearing 116, and a lower end connected to a drive shaft 113*a* of the electric motor 113 via a coupling 117. The electric motor 113 is provided with a rotational position detecting unit 118 which detects the rotational position of the drive shaft 113*a*. The rotational position detecting unit 118 includes, for example, a rotary encoder, and an output signal of the rotary encoder is inputted to the controller 40.

The operation of the lift actuator 111, more specifically, the operation of the electric motor 113, is controlled by the controller 40. Thus, the lift actuator 111 can locate the disk lifting permanent magnet 64 at any height position between an upper position and a lower position. The lower position is set so that the disk lifting permanent magnet 64 is located at a position sufficiently lower than the turntable 7 and distances between the disk lifting permanent magnet 64 and the protection disk permanent magnets 60 are sufficient to reduce a magnetic repulsive force generated between the disk lifting permanent magnet 64 and the protection disk permanent magnets 60 to smaller than the gravity acting on the protection disk 15. The upper position is set higher than the lower position so that the protection disk 15 connected to the magnet retaining members 61 can be moved up to the adjacent position (treatment height position) close to the lower surface of the substrate W by a magnetic repulsive force generated between the disk lifting permanent magnet 64 and the protection disk permanent magnets 60.

Therefore, when the lift actuator 111 is actuated to move up the disk lifting permanent magnet 64 from the lower position to the upper position, the magnetic repulsive force generated between the disk lifting permanent magnet 64 and the protection disk permanent magnets 60 surpasses the gravity acting on the protection disk 15 and other lift resistance (frictional force and the like) in the upward movement of the disk lifting permanent magnet 64. Thus, the protection disk 15 is levitated from the upper surface of the turntable 7 to be moved up to the adjacent position (treatment height position) close to the lower surface of the substrate W. The flanges 20 provided at the lower ends of the guide shafts 17 are respectively brought into abutment against the lower ends of the linear bearings 18 to limit the upward movement of the protection disk 15. On the other hand, when the lift actuator 111 is actuated to move down the disk lifting permanent magnet 64 from the upper position to the lower position, the gravity acting on the protection disk 15 surpasses the magnetic repulsive force generated between the disk lifting permanent magnet 64 and the protection disk permanent magnets 60 and other downward movement resistance (frictional force and the like) in the downward movement of the disk lifting permanent magnet 64. Thus, the protection disk 15 is moved down from the adjacent position close to the lower surface of the substrate W to reach the turntable 7.

The lift actuator 111 includes the ball screw mechanism 112 and the like, so that the position of the disk lifting permanent magnet 64 can be controlled at any position intermediate between the upper position and the lower position as described above. More specifically, the controller 40 detects the rotational position of the drive shaft 113*a* of the electric motor 113 with reference to the output signal of the rotational position detecting unit 118, and detects the height position of the disk lifting permanent magnet 64 indirectly based on the rotational position. Thus, the controller 40 can control the height position of the disk lifting permanent magnet 64 at any height position between the upper position and the lower position. Thus, the position of the protection disk 15 can be controlled not only at the two positions, i.e., the upper position and the lower position, but also at any height position between the turntable 7 and the substrate holding height position above the spin chuck 2.

The controller 40 may be programmed so as to change the height position of the protection disk 15 according to a substrate treatment to be performed. Where the upper surface of the substrate W is scrubbed with the cleaning brush 36, for example, the substrate W is liable to be warped downward. To cope with this, the controller 40 levitates the protection disk 15 from the turntable 7 to locate the protection disk 15 at a scrub-cleaning height position so as to prevent the substrate W from contacting the protection disk 15 even if the substrate W is warped downward. That is, the controller 40 controls the lift actuator 111 so as to locate the protection disk 15 at the scrub-cleaning height position. On the other hand, where a liquid treatment process is performed on the substrate W simply by supplying a chemical liquid or a rinse liquid to the substrate W without the scrubbing or where a spin-drying process is performed on the substrate W by rotating the substrate W to spin out a liquid component from the substrate W, the substrate W is not significantly warped downward. Therefore, the controller 40 controls the lift actuator 111 to locate the protection disk 15 at a position higher than the scrub-cleaning height position to reduce the distance between the protection disk 15 and the lower surface of the substrate W. This more reliably prevents the intrusion of the treatment liquid mist into the space below the lower surface of the substrate W.

In the third embodiment, the magnetic levitation mechanism 41 thus includes the dedicated disk lifting permanent margent 64, and the dedicated lift actuator 111 which moves up and down the disk lifting permanent magnet 64. This makes it possible to move up and down the protection disk 15 independently of the vertical movement of the splash guard 4 and the driving of the movable pins 12. In addition, the lift actuator 111 is configured so as to control the position of the protection disk 15 at any height position between the turntable 7 and the substrate holding height position. Thus, the distance between the protection disk 15 and the lower surface of the substrate W can be properly adjusted according to a treatment process to be performed.

Figure 9:
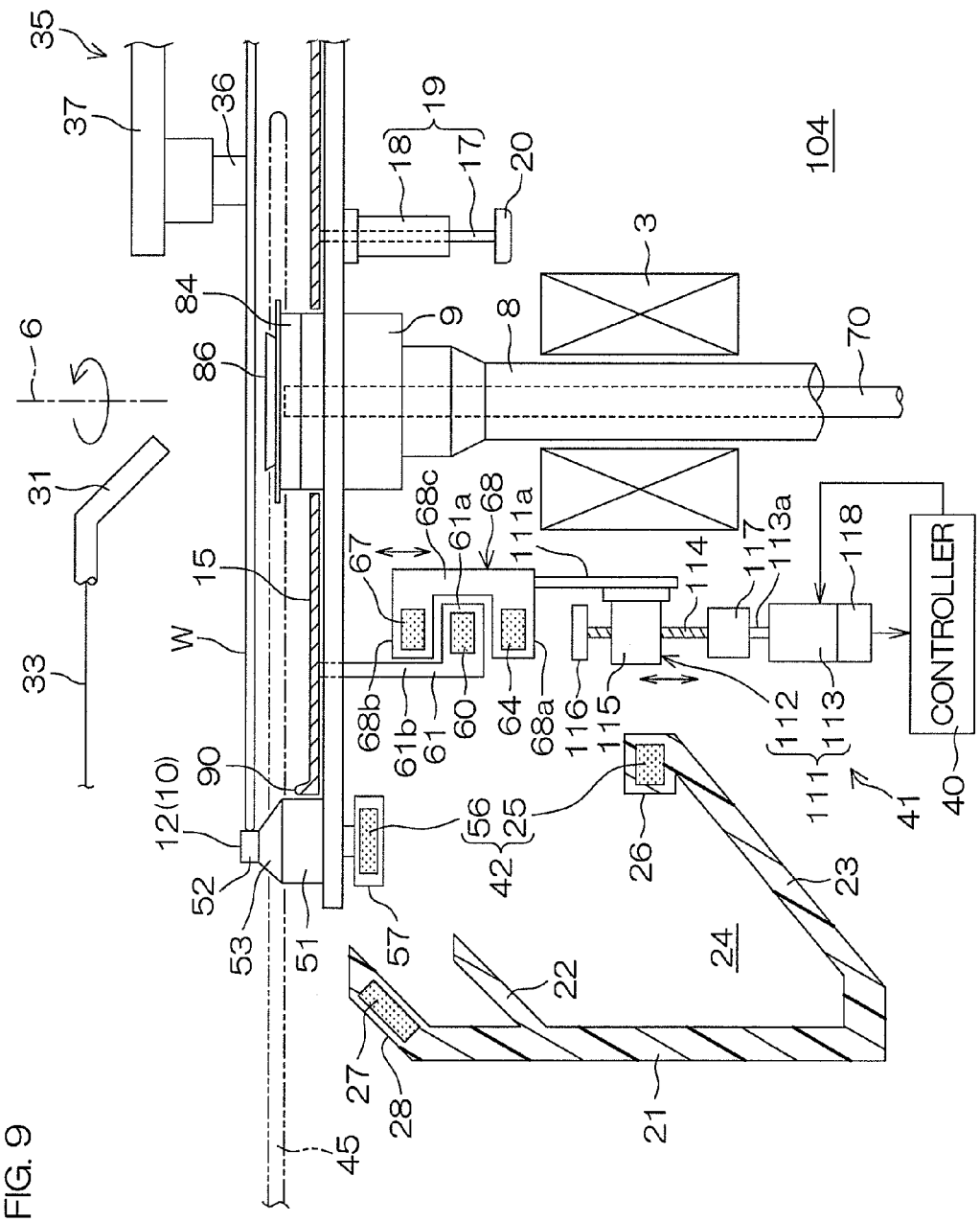
FIG. 9 is a schematic sectional view for explaining the construction of a substrate treatment apparatus according to a fourth embodiment of the present invention.

FIG. 9 is a schematic sectional view for explaining the construction of a substrate treatment apparatus 104 according to a fourth embodiment of the present invention. In FIG. 9, components corresponding to those shown in FIG. 8 are designated by the same reference characters as in FIG. 8.

In this embodiment, a second disk lifting permanent magnet 67 opposed to the protection disk permanent magnets 60 from an upper side is provided in addition to the disk lifting permanent magnet 64 (hereinafter referred to as "first disk lifting permanent magnet 64"). That is, the protection disk permanent magnets 60 are sandwiched between the first and second disk lifting permanent magnets 64 and 67 from the upper and lower sides. The second disk lifting permanent magnet 67 is an annular permanent magnet piece disposed in a horizontal plane about the rotation axis 6, and has an annular magnetic pole opposed to the protection disk permanent magnets 60 from the upper side. The magnetic pole has the same polarity as the upper magnetic poles of the protection disk permanent magnets 60. Therefore, the second disk lifting permanent magnet 67 applies a downward repulsive magnetic force to the protection disk permanent magnets 60. Therefore, the protection disk permanent magnets 60 receive an upward repulsive magnetic force from the first disk lifting permanent magnet 64 from the lower side, and receive the downward repulsive magnetic force from the second disk lifting permanent magnet 67 from the upper side. Then, the protection disk permanent magnets 60 are held between the first and second disk lifting permanent magnets 64 and 67 in a non-contact manner at a position at which these repulsive magnetic forces are balanced with the gravity and the like acting on the protection disk 15.

The first and second disk lifting permanent magnets 64, 67 are incorporated and retained in an annular magnet retaining member 68. An actuation member 111a of the lift actuator 111 is connected to the magnet retaining member 68. The magnetic retaining member 68 has a laterally open U-shaped cross section (outwardly open U-shaped cross section) taken perpendicularly to its circumference, and includes an annular lower retaining portion 68a which retains the first disk lifting permanent magnet 64, an annular upper retaining portion 68b which retains the second disk lifting permanent magnet 67, and a tubular connection portion 68c connecting inner peripheral edge portions of the lower retaining portion 68a and the upper retaining portion 68b. A space for accommodating the protection disk permanent magnets 60 is provided between the lower retaining portion 68a and the upper retaining portion 68b outward of the tubular connection portion 68c. Distal end portions 61a of the magnet retaining members 61 are inserted in this space from a radially outward side about the rotation axis.

In this embodiment, the magnet retaining members 61 each include a pendent portion 61b extending downward from the protection disk 15, and the distal end portions 61a each extend inward from a lower end of the pendent portion 61b toward the rotation axis 6. Thus, the magnet retaining members 61 each have a generally L-shape. The protection disk permanent magnets 60 are each embedded in the distal end portion 61a.

The first and second disk lifting permanent magnets 64, 67 each have annular magnetic poles. With the spin chuck 2 assuming any rotational position, therefore, the protection disk permanent magnets 60 receive the magnetic forces from the first and second disk lifting permanent magnets 64, 67 to be thereby held between the first and second disk lifting permanent magnets 64 and 67 in a non-contact state.

This arrangement provides the same effects as the arrangement according to the third embodiment. In addition, the protection disk permanent magnets 60 receive the magnetic repulsive forces from the upper and lower sides, making it possible to accurately control the vertical positions of the protection disk permanent magnets 60. This improves the position controlling accuracy for controlling the position of the protection disk 15, thereby further suppressing the adhesion of the treatment liquid mist to the lower surface of the substrate W.

Figure 10:
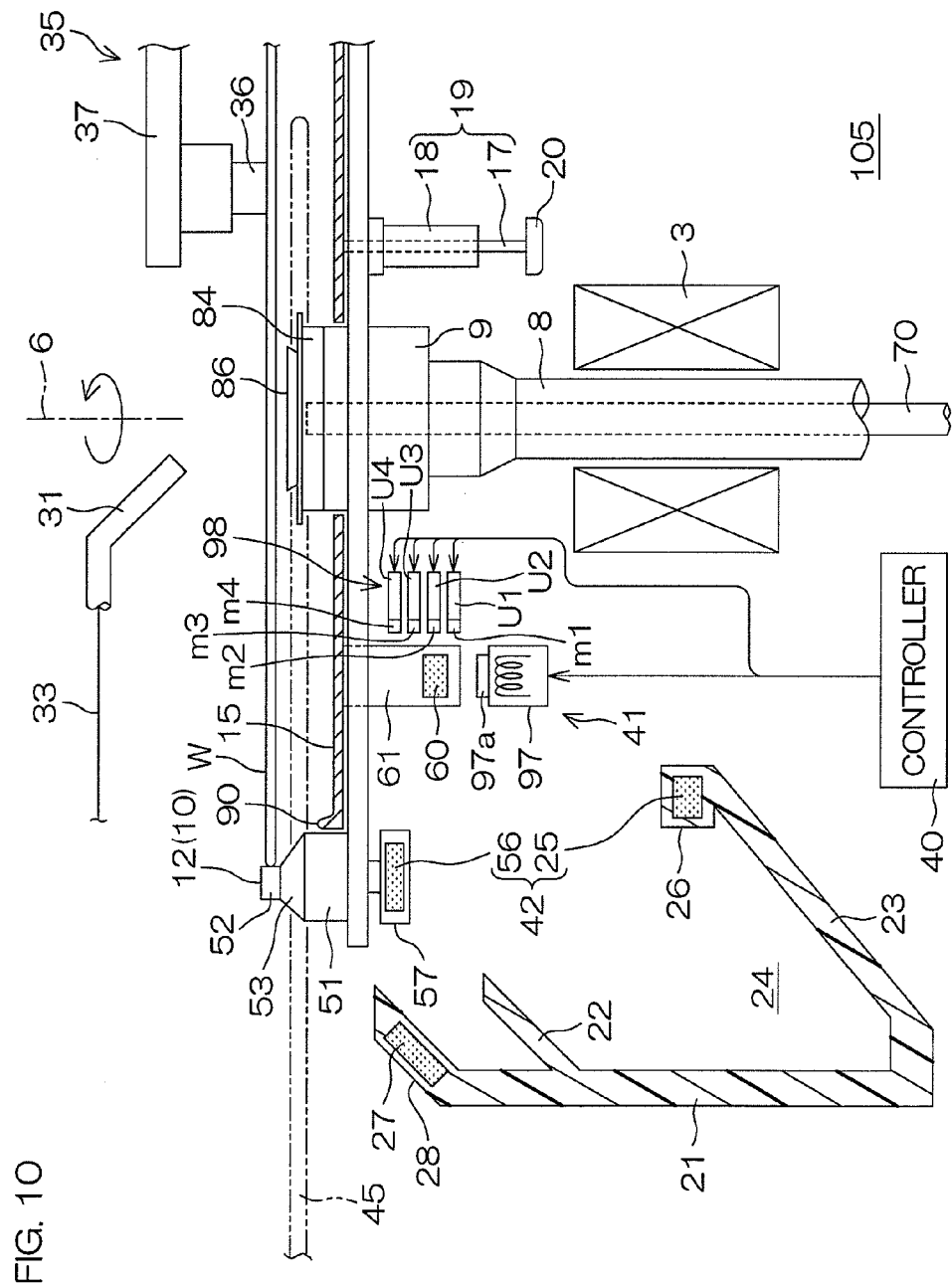
FIG. 10 is a schematic sectional view for explaining the construction of a substrate treatment apparatus according to a fifth embodiment of the present invention.

FIG. 10 is a schematic sectional view for explaining the construction of a substrate treatment apparatus 105 according to a fifth embodiment of the present invention. In FIG. 10, components corresponding to those shown in FIG. 7 are designated by the same reference characters as in FIG. 7. In the fifth embodiment, a drive source dedicated for the magnetic levitation mechanism 41 is provided as in the second embodiment.

In the fifth embodiment, the magnetic levitation mechanism 41 includes protection disk permanent magnets 60, a disk lifting electromagnetic device 97 and a height controlling electromagnetic device 98.

The disk lifting electromagnetic device 97 has an annular magnetic pole 97a disposed in a horizontal plane about the rotation axis 6, and the annular magnetic pole 97a is opposed to the protection disk permanent magnets 60 from the lower side. When the disk lifting electromagnetic device 97 is energized with a first direction electric current flowing in a first direction to be thereby magnetized, the magnetic pole 97a has the same polarity as the lower magnetic poles of the protection disk permanent magnets 60. Further, when the disk lifting electromagnetic device 97 is energized with a second direction electric current flowing in a second direction opposite from the first direction to be thereby magnetized, the magnetic pole 97a has a polarity different from the polarity of the lower magnetic poles of the protection disk permanent magnets 60. Therefore, when the disk lifting electromagnetic device 97 is energized with the first direction electric current, an upward repulsive magnetic force acts on the protection disk permanent magnets 60. When the disk lifting electromagnetic device 97 is energized with the second direction electric current, a downward attractive magnetic force acts on the protection disk permanent magnets 60. When the energization is stopped, these magnetic forces disappear.

With the disk lifting electromagnetic device 97 energized with the second direction electric current or with the disk lifting electromagnetic device 97 not energized, the protection disk 15 is controlled to be located at the lower position close to the turntable 7. With the disk lifting electromagnetic device 97 energized with the first direction electric current, on the other hand, the protection disk 15 is levitated above the turntable 7 by a repulsive magnetic force generated between the magnetic pole 97a and the protection disk permanent magnets 60. The energization of the disk lifting electromagnetic device 97 is controlled by the controller 40.

The height controlling electromagnetic device 98 includes a plurality of electromagnetic units U1, U2, U3, . . . respectively having annular magnetic poles m1, m2, m3, . . . each disposed in a horizontal plane about the rotation axis 6. The magnetic poles m1, m2, m3, . . . are equidistantly arranged vertically parallel to the rotation axis 6 so as to respectively have cylindrical magnetic pole surfaces having the same radius and facing outward (away from the rotation axis 6). More specifically, the magnetic poles m1, m2, m3, . . . are arranged along the range of the vertical movement and the rotational movement of the protection disk permanent magnets 60 so as to exert magnetic forces on the protection disk permanent magnets 60 without interference with the magnet retaining members 61. In the arrangement shown in FIG. 10, the magnetic poles m1, m2, m3, . . . are disposed inward of the movement range of the protection disk permanent magnets 60, but may be disposed outward of the movement range of the protection disk permanent magnets 60. Further, the magnetic poles m1, m2, m3, . . . may be disposed inward and outward of the movement range of the protection disk permanent magnets 60.

The electromagnetic units U1, U2, U3, . . . are each configured so that the magnetic poles m1, m2, m3, . . . thereof each have one of opposite polarities when they are energized with an electric current flowing in one of opposite directions, and each have the other polarity when they are energized with an electric current flowing in the other direction. Therefore, an attractive magnetic force (attractive force) or a repulsive magnetic force (repulsive force) is generated between the magnetic poles m1, m2, m3, . . . and the protection disk permanent magnets 60 according to the direction of the electric current to be applied to the electromagnetic units U1, U2, U3, . . . and the height position of the protection disk permanent magnets 60. The magnitude of the magnetic force depends on the magnitude of the electric current to be applied to the electromagnetic units U1, U2, U3, . . . .

Thus, the height position of the protection disk permanent magnets 60 can be controlled by controlling the direction and the magnitude of the electric current to be applied to the electromagnetic units U1, U2, U3, . . . . That is, the controller 40 controls the energization of the electromagnetic units U1, U2, U3, . . . to control the height position of the protection disk permanent magnets 60, i.e., the height position of the protection disk 15.

The controller 40 levitates the protection disk 15 from the turntable 7 and, when controlling the height position of the protection disk 15, energizes the disk lifting electromagnetic device 97 with the first direction electric current and controls the energization of the electromagnetic units U1, U2, U3, . . . according to a control target height position. Thus, the protection disk 15 can be located at the control target height position between the turntable 7 and the substrate holding height position. Therefore, the protection disk 15 can be located at a proper height position according to the treatment process as in the third embodiment.

The magnitude of the magnetic repulsive force generated between the magnetic pole 97a and the protection disk permanent magnet 60 can be controlled by controlling the magnitude of the electric current to be applied to the disk lifting electromagnetic device 97. This makes it possible to control the height position of the protection disk permanent magnets 60, i.e., the height position of the protection disk 15. Therefore, the height position of the protection disk 15 may be controlled by controlling the energization of the disk lifting electromagnetic device 97 without the provision of the height controlling electromagnetic device 98.

Figure 11:
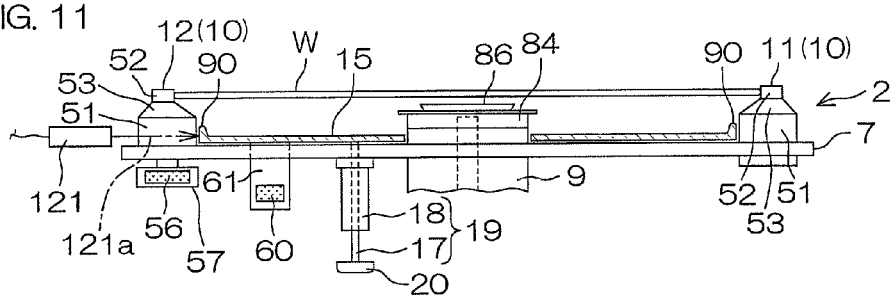
FIG. 11 is a diagram showing an exemplary arrangement for detecting the position of a protection disk.

FIG. 11 is a diagram showing an exemplary arrangement for detecting the position of the protection disk 15. In this exemplary arrangement, a photosensor 121 is provided for checking if the protection disk 15 is located at the lower position on the turntable 7. An output signal of the photosensor 121 is inputted to the controller 40. The photosensor 121 is disposed on a lateral side of the turntable 7, and has a detection light axis 121a which is adjusted to extend in a horizontal plane at the lower position of the protection disk 15. When the protection disk 15 is located at the lower position, the detection light axis 121a of the photosensor 121 aligns with the protection disk 15. Therefore, the presence of the protection disk 15 at the lower position can be detected by detecting the blocking or the reflection of light by the protection disk 15. The controller 40 checks the operation of the magnetic levitation mechanism 41 by thus checking the presence of the protection disk 15 at the lower position.

Figure 12:
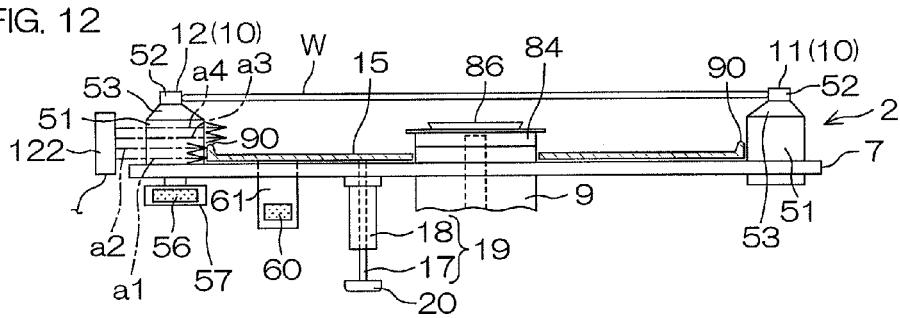
FIG. 12 is a diagram showing another exemplary arrangement for detecting the position of the protection disk.

FIG. 12 is a diagram showing another exemplary arrangement for detecting the position of the protection disk 15. In this exemplary arrangement, a line sensor 122 is provided for detecting the height position of the protection disk 15 above the turntable 7. An output signal of the line sensor 122 is inputted to the controller 40. The line sensor 122 is of a multiple-light-axis type which includes a plurality of light axes a1, a2, a3, . . . located at different height positions. That is, the light exes a1, a2, a3, . . . are parallel to each other, and each extend in a horizontal plane. The light axes a1, a2, a3, . . . are disposed between the upper surface of the turntable 7 and the substrate holding height position as corresponding to different height positions of the protection disk 15. Therefore, one of the light axes a1, a2, a3, . . . aligns with the protection disk 15 depending on the height position of the protection disk 15. Thus, the height position of the protection disk 15 can be detected by detecting the blocking or the reflection of light traveling along a corresponding one of the light axes by the protection disk 15. The controller 40 checks the operation of the magnetic levitation mechanism 41 or controls the magnetic levitation mechanism 41 by thus acquiring information about the height position of the protection disk 15.

Figure 13:
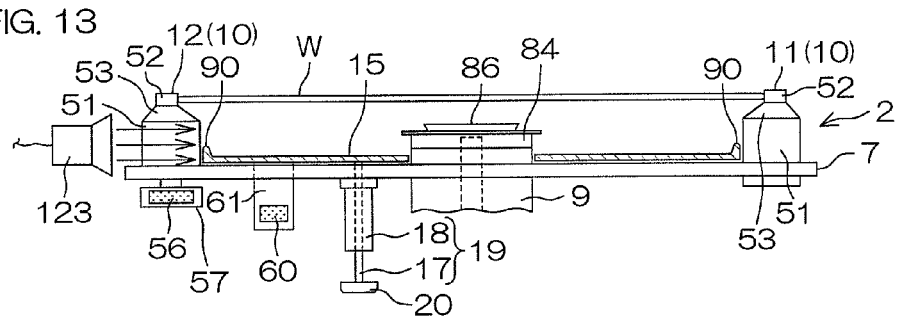
FIG. 13 is a diagram showing further another exemplary arrangement for detecting the position of the protection disk.

FIG. 13 is a diagram showing further another exemplary arrangement for detecting the position of the protection disk 15. In this exemplary arrangement, a camera 123 is provided for detecting the height position of the protection disk 15 above the turntable 7. An image signal outputted from the camera 123 is inputted to the controller 40. The camera 123 is disposed so as to take an image of an imaging region between the turntable 7 and the substrate holding height position from a lateral side of the spin chuck 2. Therefore, the protection disk 15 is present in the imaging region. The controller 40 computes the height position of the protection disk 15 by processing the image signal outputted from the camera 123. The controller 40 checks the operation of the magnetic levitation mechanism 41 or controls the magnetic levitation mechanism 41 by thus acquiring information about the height position of the protection disk 15.

Figure 14:
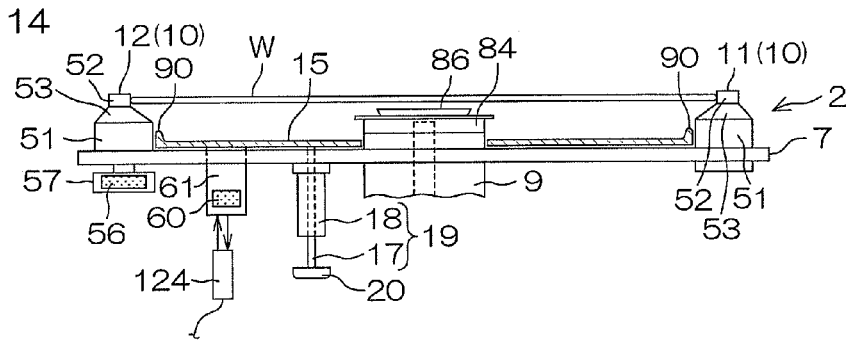
FIG. 14 is a diagram showing still another exemplary arrangement for detecting the position of the protection disk.

FIG. 14 is a diagram showing still another exemplary arrangement for detecting the position of the protection disk 15. In this exemplary arrangement, a distance sensor 124 is provided for detecting the height position of the protection disk 15 above the turntable 7. An output signal of the distance sensor 124 is inputted to the controller 40. In the exemplary arrangement shown in FIG. 14, the distance sensor 124 is disposed below a magnet retaining member 61, and is configured to detect a distance to the magnet retaining member 61. Since the magnet retaining member 61 is connected to the protection disk 15, the distance detected by the distance sensor 124 corresponds to the height of the protection disk 15 above the turntable 7. The distance sensor 124 may be adapted to measure the distance by generating a probe signal such as an ultrasonic probe signal or an optical probe signal and detecting a probe signal reflected on the magnet retaining member 61. The controller 40 acquires information about the height position of the protection disk 15 based on the output signal of the distance sensor 124, and checks the operation of the magnetic levitation mechanism 41 or controls the magnetic levitation mechanism 41 based on the acquired information.

While the embodiments of the present invention have thus been described, the invention may be embodied in other ways. As shown by a two-dot-and-dash line in FIG. 4, a skirt portion 93 serving as a lateral side covering member for covering the space defined between the lower surface of the substrate W and the turntable 7 from a lateral side may be fixed to a peripheral edge portion of the protection disk 15. The skirt portion 93 has an annular shape extending along the peripheral edge of the protection disk 15, and has a generally laterally-inverted L-shaped section taken perpendicularly to the peripheral edge. More specifically, the skirt portion 93 includes a horizontal portion 94 horizontally extending along a lower surface of the protection disk 15, and a pendent portion 95 extending vertically downward from the horizontal portion 94 outside the turntable 7. When the protection disk 15 is located at the adjacent position, the skirt portion 93 covers the space defined between the lower surface of the protection disk 15 and the turntable 7 from the lateral side, thereby substantially preventing an ambient atmosphere from being caught into the space. This stabilizes an air stream occurring around the spin chuck 2, making it possible to perform a higher-quality substrate treatment. When the protection disk 15 is located at the lower position, the skirt portion 93 is retracted downward together with the protection disk 15, and the space defined between the upper surface of the protection disk 15 and the substrate holding height position of the holding pins 10 is laterally open. Therefore, the substrate W can be loaded and unloaded by inserting the substrate holding hand 45 into the space.

Although the guard drive mechanism 5 for moving up and down the splash guard 4 doubles as a drive source for the magnetic drive mechanism 42 in the embodiments described above, the drive source for the magnetic drive mechanism 42 may be additionally provided.

In the embodiments described above, the magnetic drive mechanism 42 is provided for driving the movable pins 12 by the magnetic force, but a drive mechanism for driving the movable pins 12 may be incorporated in the turntable 7. Although the inert gas is supplied into the space defined between the protection disk 15 and the lower surface of the substrate W in the embodiments described above, the supply of the inert gas may be obviated.

Although, in the embodiments described above, the inert gas supply is stopped after the substrate rotation is stopped, the inert gas supply may be stopped when the spin dry process is initiated.

Although the embodiments described above are directed to an exemplary case in which the upper surface of the substrate W is scrubbed with the cleaning brush, the present invention is applicable to a case in which the upper surface of the substrate W is cleaned by supplying a liquid droplet jet stream onto the surface of the substrate W from a bifluid nozzle rather than by using the cleaning brush. Additionally, the present invention is applicable to an ultrasonic cleaning process to be performed to clean the substrate by supplying a treatment liquid vibrated by ultrasonic waves onto the surface of the substrate, and a high pressure jet cleaning process to be performed to clean the substrate by supplying a pressurized treatment liquid at a higher flow rate onto the surface of the substrate. The present invention is applicable not only to these cleaning processes but also to a coating process in which the surface of the substrate is coated with a resist, and a developing process in which a developing liquid is supplied to a resist film after exposure of the resist film.

Further, the embodiments described above are directed to an arrangement for driving the movable pins 12 by utilizing the attractive force generated between the permanent magnets, but the driving of the movable pins 12 may be achieved by providing non-magnetized magnetic members eccentrically to the rotation axes 12a of the movable pins 12 instead of the pin driving permanent magnets 56. Further, the driving of the movable pins 12 may be achieved by providing permanent magnets eccentrically to the rotation axes 12a of the movable pins 12 and providing non-magnetized magnetic members at positions corresponding to the guard permanent magnet 25 and the cancelation permanent magnet 27.

In the embodiments described above, the magnetic pole direction of the guard permanent magnet 25 is horizontal by way of example. The magnetic pole direction of the guard permanent magnet 25 may be vertical, or may be inclined with respect to a horizontal plane.

The embodiments described above are directed to a case in which the turntable 7 of the spin chuck 2 is located at the predetermined height position and the splash guard 4 is movable up and down relative to the turntable 7 along the rotation axis 6. However, the relative movement of the splash guard 4 and the turntable 7 may be achieved by fixing the splash guard 4 and moving up and down the spin chuck 2 or by moving up and down both the spin chuck 2 and the splash guard 4.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2011-277402 and 2012-74620 filed in the Japan Patent Office on Dec. 19, 2011 and Mar. 28, 2012, respectively, the disclosure of which is incorporated herein by reference by its entirety.

What is claimed is:

1. A substrate treatment apparatus comprising:
a substrate holding and rotating device; and
a treatment liquid supply unit which supplies a treatment liquid to an upper surface of a substrate held by the substrate holding and rotating device;
the substrate holding and rotating device comprising:
a turntable rotatable about a vertical rotation axis;
a rotative drive unit which rotates the turntable;
a holding member which is provided on the turntable and horizontally holds the substrate in upwardly spaced relation to the turntable;
a protection disk disposed between the turntable and a substrate holding position at which the substrate is held by the holding member, and attached to the turntable so as to be vertically movable relative to the turntable between a lower position and an adjacent position closer than the lower position to a lower surface of the substrate held by the holding member above the lower position, the protection disk having a notch provided in a peripheral portion thereof at a position corresponding to a position of the holding member to border the holding member;
a lateral side covering member which is attached to the protection disk and covers a space defined between the substrate held by the holding member and the turntable from a lateral side of the turntable;
wherein the lateral side covering member includes a skirt portion having a first portion extending radially outwardly from a peripheral edge of the protection disk and a second portion extending downwardly from the first portion outside of the turntable;
a magnetic levitation mechanism including a first magnet attached to the protection disk, a second magnet which has an annular shape coaxial about the vertical rotation axis and generates a repulsive force with respect to the first magnet, a first support member which non-rotatably supports the second magnet, and a first relative movement mechanism which moves the first support member relative to the turntable so as to change a distance between the first magnet and the second magnet, the magnetic levitation mechanism being configured to levitate the protection disk from the turntable by the repulsive force generated between the first magnet and the second magnet; and
an inert gas supply unit which supplies an inert gas, which does not undergo chemical reactions under operating conditions of the substrate treatment apparatus, to a space defined between the substrate held and rotated by the substrate holding and rotating device and the protection disk located at the adjacent position;
wherein the protection disk has a restriction portion provided on an upper surface thereof, the restriction portion defines an orifice between the restriction portion and a peripheral edge of the lower surface of the substrate held by the holding member, and the orifice restricts an inert gas flow passage defined between the substrate held by the holding member and the protection disk.

2. The substrate treatment apparatus according to claim 1, further comprising a receiving member which receives a treatment liquid supplied from the treatment liquid supply unit to the substrate held by the substrate holding and rotating device and flowing outward from the surface of the substrate,
wherein the first support member is fixed to the receiving member,
wherein the first relative movement mechanism is configured to move the receiving member and the turntable relative to each other.

3. The substrate treatment apparatus according to claim 1, wherein the inert gas supply unit includes an inert gas nozzle which ejects the inert gas radially toward a peripheral edge of the substrate held by the holding member from a rotation center of the turntable.

* * * * *